US011790962B2

(12) United States Patent
Stott et al.

(10) Patent No.: US 11,790,962 B2
(45) Date of Patent: *Oct. 17, 2023

(54) STROBE ACQUISITION AND TRACKING

(71) Applicant: Rambus Inc., San Jose, CA (US)

(72) Inventors: Bret Stott, Menlo Park, CA (US); Frederick A. Ware, Los Altos Hills, CA (US); Ian P. Shaeffer, Los Gatos, CA (US); Yuanlong Wang, Sunnyvale, CA (US)

(73) Assignee: RAMBUS INC., San Jose, CA (US)

( * ) Notice: Subject to any disclaimer, the term of this patent is extended or adjusted under 35 U.S.C. 154(b) by 50 days.

This patent is subject to a terminal disclaimer.

(21) Appl. No.: 17/305,654

(22) Filed: Jul. 12, 2021

(65) Prior Publication Data

US 2022/0084571 A1    Mar. 17, 2022

Related U.S. Application Data

(63) Continuation of application No. 16/459,330, filed on Jul. 1, 2019, now Pat. No. 11,062,748, which is a (Continued)

(51) Int. Cl.
*G11C 7/22* (2006.01)
*G06F 13/16* (2006.01)
*G11C 7/02* (2006.01)

(52) U.S. Cl.
CPC .......... *G11C 7/222* (2013.01); *G06F 13/1689* (2013.01); *G11C 7/02* (2013.01); *G11C 7/22* (2013.01)

(58) Field of Classification Search
CPC .. G11C 7/222; G11C 7/02; G11C 7/22; G06F 13/1689
See application file for complete search history.

(56) References Cited

U.S. PATENT DOCUMENTS 6,453,402 B1    9/2002  Jeddeloh
6,629,222 B1    9/2003  Jeddeloh
(Continued)

FOREIGN PATENT DOCUMENTS

JP      2006-330974 A    12/2006
WO     WO-2006-023387   3/2006

OTHER PUBLICATIONS

International Preliminary Report on Patentability dated Jul. 2, 2009, for the International Application No. PCT/US2007/088244 with Filing Date Dec. 19, 2007. 7 pages.
(Continued)

*Primary Examiner* — Vincent H Tran
(74) *Attorney, Agent, or Firm* — Morgan, Lewis & Bockius LLP

(57) ABSTRACT

A memory controller includes an interface to receive a data strobe signal and corresponding read data. The data strobe signal and the read data correspond to a read command issued by the memory controller, and the read data is received in accordance with the data strobe signal and an enable signal. A circuit in the memory controller is to dynamically adjust a timing offset between the enable signal and the data strobe signal, and control logic is to issue a supplemental read command in accordance with a determination that a time interval since a last read command issued by the memory controller exceeds a predetermined value.

20 Claims, 17 Drawing Sheets

Related U.S. Application Data continuation of application No. 15/665,312, filed on Jul. 31, 2017, now Pat. No. 10,339,990, which is a continuation of application No. 15/017,415, filed on Feb. 5, 2016, now Pat. No. 9,721,630, which is a continuation of application No. 13/959,633, filed on Aug. 5, 2013, now Pat. No. 9,257,163, which is a continuation of application No. 12/520,068, filed as application No. PCT/US2007/088244 on Dec. 19, 2007, now Pat. No. 8,504,788.

(60) Provisional application No. 60/876,408, filed on Dec. 20, 2006.

(56) References Cited

U.S. PATENT DOCUMENTS

| | | | |
|---|---|---|---|
| 6,889,336 B2 | 5/2005 | Schoenfeld et al. | |
| 7,062,625 B1* | 6/2006 | Shrader | G11C 7/1087 711/167 |
| 7,177,379 B1* | 2/2007 | Shihadeh | H04L 7/0338 375/354 |
| 7,196,948 B1* | 3/2007 | Vemula | G11C 7/222 365/194 |
| 7,670,263 B2 | 3/2010 | Ellis et al. | |
| 7,755,402 B1 | 7/2010 | Ku et al. | |
| 8,504,788 B2 | 8/2013 | Stott et al. | |
| 9,257,163 B2* | 2/2016 | Stott | G06F 13/1689 |
| 9,721,630 B2* | 8/2017 | Stott | G11C 7/02 |
| 10,339,990 B2* | 7/2019 | Stott | G11C 7/02 |
| 11,062,748 B2* | 7/2021 | Stott | G11C 7/22 |
| 2001/0046163 A1* | 11/2001 | Yanagawa | G06F 13/1689 365/194 |
| 2002/0184461 A1* | 12/2002 | Zumkehr | G06F 13/4239 711/167 |
| 2003/0046596 A1 | 3/2003 | Floyd et al. | |
| 2003/0179611 A1 | 9/2003 | Liou | |
| 2005/0047222 A1* | 3/2005 | Rentschler | G11C 7/1093 365/193 |
| 2005/0242850 A1 | 11/2005 | Kawasaki | |
| 2005/0285174 A1 | 12/2005 | Saito et al. | |
| 2005/0286506 A1 | 12/2005 | LaBerge | |
| 2006/0052961 A1 | 3/2006 | Best | |
| 2006/0083081 A1 | 4/2006 | Park et al. | |
| 2006/0107011 A1 | 5/2006 | Nystuen et al. | |
| 2006/0112250 A1* | 5/2006 | Walker | G06F 13/1689 711/167 |
| 2006/0136769 A1 | 6/2006 | Kizer et al. | |
| 2006/0140021 A1 | 6/2006 | Ha et al. | |
| 2006/0200642 A1 | 9/2006 | LaBerge | |
| 2006/0203948 A1 | 9/2006 | Lin | |
| 2006/0233012 A1 | 10/2006 | Sekiguchi et al. | |
| 2006/0245276 A1* | 11/2006 | Huang | G11C 7/1066 365/193 |
| 2006/0262613 A1 | 11/2006 | Braun et al. | |
| 2007/0005876 A1 | 1/2007 | Ikeda et al. | |
| 2007/0008791 A1 | 1/2007 | Butt et al. | |
| 2007/0217559 A1 | 9/2007 | Stott et al. | |
| 2008/0005518 A1 | 1/2008 | Gillingham et al. | |
| 2008/0019189 A1* | 1/2008 | Lin | G11C 7/20 365/185.23 |
| 2008/0071966 A1 | 3/2008 | Hughes | |
| 2011/0019489 A1 | 1/2011 | Huang et al. | |
| 2011/0222358 A1 | 9/2011 | Ware | |
| 2014/0145756 A1 | 5/2014 | Chong et al. | |

OTHER PUBLICATIONS

International Search Report and Written Opinion issued in PCT/US2007/088244, dated Jul. 1, 2008, 8 pages by ISA/EP.

Stott, Bret re U.S. Appl. No. 12/520,068, filed Jun. 18, 2009 re Office Action dated Mar. 30, 2012. 28 Pages.

Stott, Bret re U.S. Appl. No. 12/520,068, filed Jun. 18, 2009 re Office Action dated Oct. 7, 2011. 26 Pages.

Stott, Bret, U.S. Appl. No. 12/520,068, filed Jun. 18, 2009, Response dated Feb. 7, 2012 to the Office Action dated Oct. 7, 2011. 16 pages.

* cited by examiner

STROBE ACQUISITION AND TRACKING

RELATED APPLICATIONS

This application is a continuation of U.S. patent application Ser. No. 16/459,330, filed Jul. 1, 2019, which is continuation of U.S. patent application Ser. No. 15/665,312, filed Jul. 31, 2017, now U.S. Pat. No. 10,339,990, which is a continuation of U.S. patent application Ser. No. 15/017,415, filed Feb. 5, 2016, now U.S. Pat. No. 9,721,630, which is a continuation of U.S. patent application Ser. No. 13/959,633, filed Aug. 5, 2013, now U.S. Pat. No. 9,257,163, which is a continuation of U.S. patent application Ser. No. 12/520,068, filed Jun. 18, 2009, now U.S. Pat. No. 8,504,788, which is a U.S. National Stage Application filed under 35 U.S.C. § 371 of PCT Patent Application Serial No. PCT/US2007/088244 filed on Dec. 19, 2007, which claims the benefit of and priority to U.S. Provisional Application Ser. No. 60/876,408 filed on Dec. 20, 2006, all which are hereby incorporated by reference in their entireties.

FIELD

The subject matter disclosed herein relates generally to circuits for use in integrated circuits, and in particular, to circuits and associated methods for synchronizing strobe signals and data signals.

BACKGROUND

Many communication systems include devices that communicate synchronously with one another. For example, some memory components utilize a strobe signal to provide source synchronous clocking events for read and write information on the data signals. Unfortunately, as the signaling or data rate is increased in such systems delays between these signals may occur.

In particular, the total communication path length between memory components is often relatively long. In the case of a read operation, the complete path includes generating the read command and address information in the clock domain of a memory controller (which is referred to as a PClk domain), transmitting this information across interconnect links between the memory controller and a memory device, receiving the information at the memory device, performing the read operation, transmitting read data signals and a corresponding strobe signal across the interconnect links to the memory controller, and receiving the read data using the strobe signal at the memory controller. This communication path includes various delays that may change as conditions vary, for example, there may be variations in temperature or a supply voltage.

The resulting delays between the data signals and the strobe signals may make it difficult for the memory controller to determine when a timing event on the strobe indicates the presence of read data, as opposed to noise. Existing approaches to this challenge include manual tuning of strobe-enable-window circuits to achieve reasonable timing for each system and silicon process. However, such adjustments are fixed, are time consuming and difficult to perform, and have limited efficacy. As such, these approaches sacrifice timing margin. In addition, these approaches may not be capable of supporting systems that have unmatched strobe drifts greater than ±1 bit time.

There is a need, therefore, for improved timing drift cancellation circuits and techniques that reduce and/or eliminating timing drift between data signals and strobe signals without the aforementioned problems.

BRIEF DESCRIPTION OF THE DRAWINGS

For a better understanding, reference should be made to the following detailed description taken in conjunction with the accompanying drawings, in which.

Like reference numerals refer to corresponding parts throughout the drawings.

DETAILED DESCRIPTION OF EMBODIMENTS

Figure 1A:
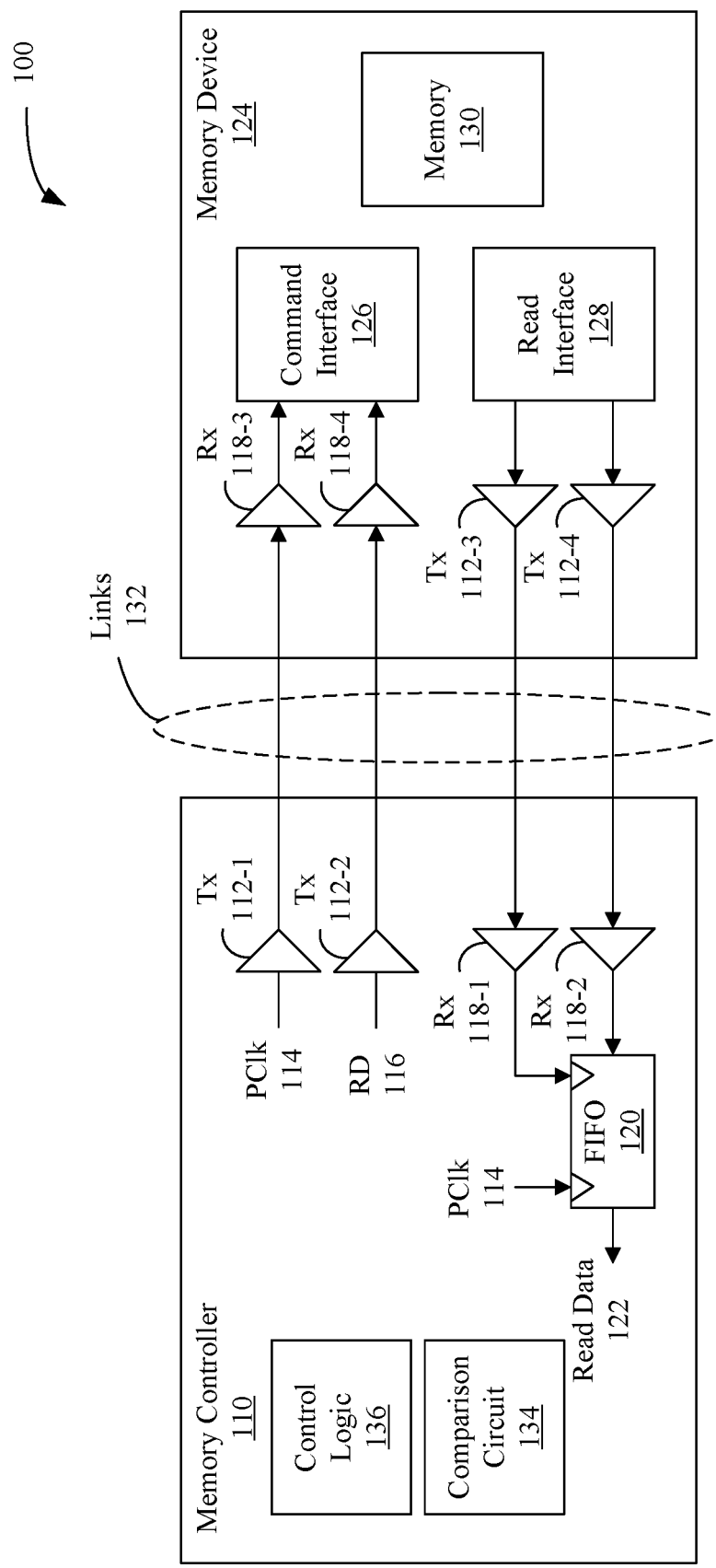
FIG. 1A is a block diagram illustrating an embodiment of a system.

Embodiments of a memory controller are described. In some embodiments, the memory controller includes a first interface to receive a data strobe signal and corresponding read data. The data strobe signal and the read data correspond to a read command issued by the memory controller, and the read data is received in accordance with the data strobe signal and an enable signal. A circuit in the memory controller is to dynamically adjust a timing offset between the enable signal and the data strobe signal, and control logic is to issue a supplemental read command if a time interval since a last read command issued by the memory controller exceeds a first predetermined value.

The data strobe signal and the corresponding read data may be received from a memory device, and the read command and the supplemental read command may be transmitted to the memory device. In some embodiments, the memory controller is to transmit and receive data on a first edge of a clock and a second edge of a clock.

The dynamic adjustment may be to approximately center the data strobe signal within a window corresponding to the enable signal. In some embodiments, the circuit is to dynamically adjust the timing offset, between the enable signal and the data strobe signal, to less than a second predetermined value in a first mode of operation. The second predetermined value may be one-half of a clock cycle.

The control logic may be to select an operating mode of the circuit in accordance with a read data error associated with the timing offset. In some embodiments, at least two consecutive read commands are to be issued during the first mode of operation.

In some embodiments, the timing offset may initially be larger than 1 clock cycle. In some embodiments, the timing offset may initially be larger than 2 clock cycles.

In some embodiments, the dynamic adjustment of the timing offset in the first mode of operation is in accordance with a received pattern corresponding to the data strobe signal and a predefined pattern, where the predefined pattern includes a data strobe signal preamble. In some embodiments, the dynamic adjustment of the timing offset in the first mode of operation is in accordance with a count value that corresponds to a number of edges in the data strobe signal during the window.

In some embodiments, the dynamic adjustment of the timing offset in the first mode of operation is in accordance with at least one pass-fail boundary at which an error between a predefined read data pattern and a received read data pattern occurs, where at least the one pass-fail boundary corresponds to an extremum of the timing offset. In some embodiments, the dynamic adjustment of the timing offset in the first mode of operation is in accordance with a first pass-fail boundary and a second pass-fail boundary, a respective pass-fail boundary corresponds to a respective timing offset, and where the respective pass-fail boundary is in accordance with the predefined read data pattern and the received read data pattern.

In some embodiments, an on-die termination in the first interface that defines a voltage level is to be biased during the first mode of operation. For example, a voltage of a data strobe signal in the first interface may be biased.

In some embodiments, the circuit is to dynamically adjust the timing offset such that it remains less than the second predetermined value in a second mode of operation. The dynamic adjustment of the timing offset in the second mode of operation may be in accordance with a received pattern corresponding to the data strobe signal and a predefined pattern, where the predefined pattern includes a data strobe signal preamble. Alternatively, the dynamic adjustment of the timing offset in the second mode of operation may be in accordance with a time of a last falling edge in the data strobe signal.

In another embodiment, a method includes receiving the data strobe signal and the corresponding read data, where the data strobe signal and the read data correspond to the read command issued by the memory controller, and the read data is received in accordance with the data strobe signal and the enable signal. The method further includes dynamically adjusting the timing offset between the enable signal and the data strobe signal, and issuing the supplemental read command if the time interval since the last read command issued by the memory controller exceeds the first predetermined value.

In another embodiment, a memory controller includes an interface to receive a data strobe signal and read data, where the data strobe signal and the read data correspond to a read command issued by the memory controller, and the read data is received in accordance with the data strobe signal and an enable signal. The memory controller includes circuitry to dynamically adjust a timing offset between the enable signal and the data strobe signal. In a first mode of operation, the dynamic adjustment of the timing offset may utilize a predefined data strobe signal preamble. In some embodiments, the dynamic adjustment of the timing offset utilizes a count value, which corresponds to the number of edges in the data strobe signal during the window defined by the enable signal. In some embodiments, the dynamic adjustment of the timing offset is based on the time of a last falling edge of the data strobe signal. And in some embodiments, the dynamic adjustment of the timing offset utilizes at least one pass-fail boundary for limiting the timing offset between the enable signal and the data strobe signal.

Reference will now be made in detail to embodiments, examples of which are illustrated in the accompanying drawings. In the following detailed description, numerous specific details are set forth in order to provide a thorough understanding of the subject matter presented herein. However, it will be apparent to one of ordinary skill in the art that the subject matter may be practiced without these specific details. In other instances, well-known methods, procedures, components, and circuits have not been described in detail so as not to unnecessarily obscure aspects of the embodiments.

Embodiments of circuits in a memory controller and a related method are described. The memory controller receives read data using a data strobe signal and an enable signal. The memory controller is configured and/or configurable to synchronize the timing of the data strobe signal and the read data by dynamically adjusting a timing offset between the enable signal and the data strobe signal. This dynamic adjustment may approximately center the data strobe signal within a window corresponding to the enable signal. The dynamic adjustment may be based on matching at least a portion of the data strobe signal with a predefined pattern, counting edges in the data strobe signal during the window, and/or one or more pass-fail boundaries at which an error between a predefined read data pattern and a received read data pattern occurs.

The memory controller may have two modes of operation. During a first mode of operation, synchronization between the data strobe signal and the read data is acquired. In some embodiments, on-die termination of an interface that defines a voltage level in the memory controller is biased during the first mode of operation. During a second mode of operation, the synchronization may be maintained by tracking the data strobe signal and the read data. If the timing offset exceeds ±1 clock cycle or bit time, the memory controller may revert to the first mode of operation.

In some embodiments, the memory controller issues a supplemental read command to a memory device if a time interval since a last read command exceeds a predetermined value, such as 10 ms, or 100 ms, or a value between 10 ms and 100 ms. In this way, a minimum read command density or rate is achieved. This allows the dynamic adjustment to be repeated sufficiently often to reliably compensate for drift in the timing offset, such as drift that may be caused by or associated with temperature, process and/or voltage variations.

The memory controller may be included in a system with at least one memory device. In some embodiments, a memory controller or memory device transmits and receives data on both the rising and falling edges of a clock, such as in dual data rate (DDR) systems. The memory device may include a memory core that utilizes solid-state memory, semiconductor memory, organic memory and/or another memory material, including volatile and/or non-volatile memory. The memory device may include dynamic random access memory (DRAM), static random access memory (SRAM) and/or electrically erasable programmable read-only memory (EEPROM). In embodiments with one or more memory devices, the memory devices may be embedded in one or more memory modules and/or two or more memory devices may be configured as a memory bank. The memory controller and the one or more memory devices may be on a common or same circuit board. The circuit may be included in one or more components in other systems, such as those that include logic chips, including a serializer/deserializer (SERDES), PCI Express and/or other high-speed interfaces or input/output links. In some embodiments, at least a portion of the aforementioned circuits may be included in one or more components in a memory system, such as one or more memory controllers and/or one or more memory devices.

We now discuss embodiments that address the difficulties associated with existing approaches for timing drift cancellation. FIG. 1A is a block diagram illustrating an embodiment of a system 100. A memory controller 110 is coupled to a memory device 124 by links 132. In some embodiments, the links 132 correspond to wired and/or wireless communication. The links 132 may be used for bi-directional and/or uni-directional communications between the memory controller 110 and the memory device 124.

Bi-directional communication may be simultaneous. In some embodiments, one or more of the links 132 and corresponding transmit circuits Tx 112 and/or receive circuits Rx 118 may be dynamically configured, for example, by control logic 136, for bi-directional and/or unidirectional communication.

Data may be communicated on one or more of the links 132 using one or more sub-channels, such as a baseband sub-channel corresponding to a first frequency band and/or a passband sub-channel corresponding to a second frequency band. In some embodiments, such as those where at least one of the links 132 is ac-coupled, the baseband sub-channel may not contain DC (i.e., does not include 0 Hz). In some embodiments, the first frequency band and the second frequency band may be orthogonal. In other embodiments there may be substantial overlap of one or more neighboring pairs of frequency bands. A respective sub-channel may also correspond to a group of frequency bands. In some embodiments, the data is encoded, for example, using one or more types of multiple pulse-amplitude modulation (PAM), such as 2-PAM and/or 4-PAM.

Transmit circuits (Tx) 112-1 and 112-2 in the memory controller 110 transmit a clock signal (PClk) 114 and a read command (RD) 116 across the links 132 to the memory device 124. In the memory device 124, the clock signal 114 and the read command 116 are received using receive circuits (Rx) 118-3 and 118-4, and are coupled to command interface 126. The read command may be performed by accessing appropriate addresses in memory 130, such as a memory core. Corresponding read data is coupled to read interface 128.

Transmit circuits 112-3 and 112-4 of the memory device 124 transmit read data signals and data strobe signals corresponding to the read data across the links 132 to the memory controller 110. Receive circuits 118-1 and 118-2 of the memory controller 110 receive the data strobe and read data signals. These signals are coupled to a first-in first-out (FIFO) memory 120, where read data 122 is determined using these signals and the clock signal 114.

Figure 1B:
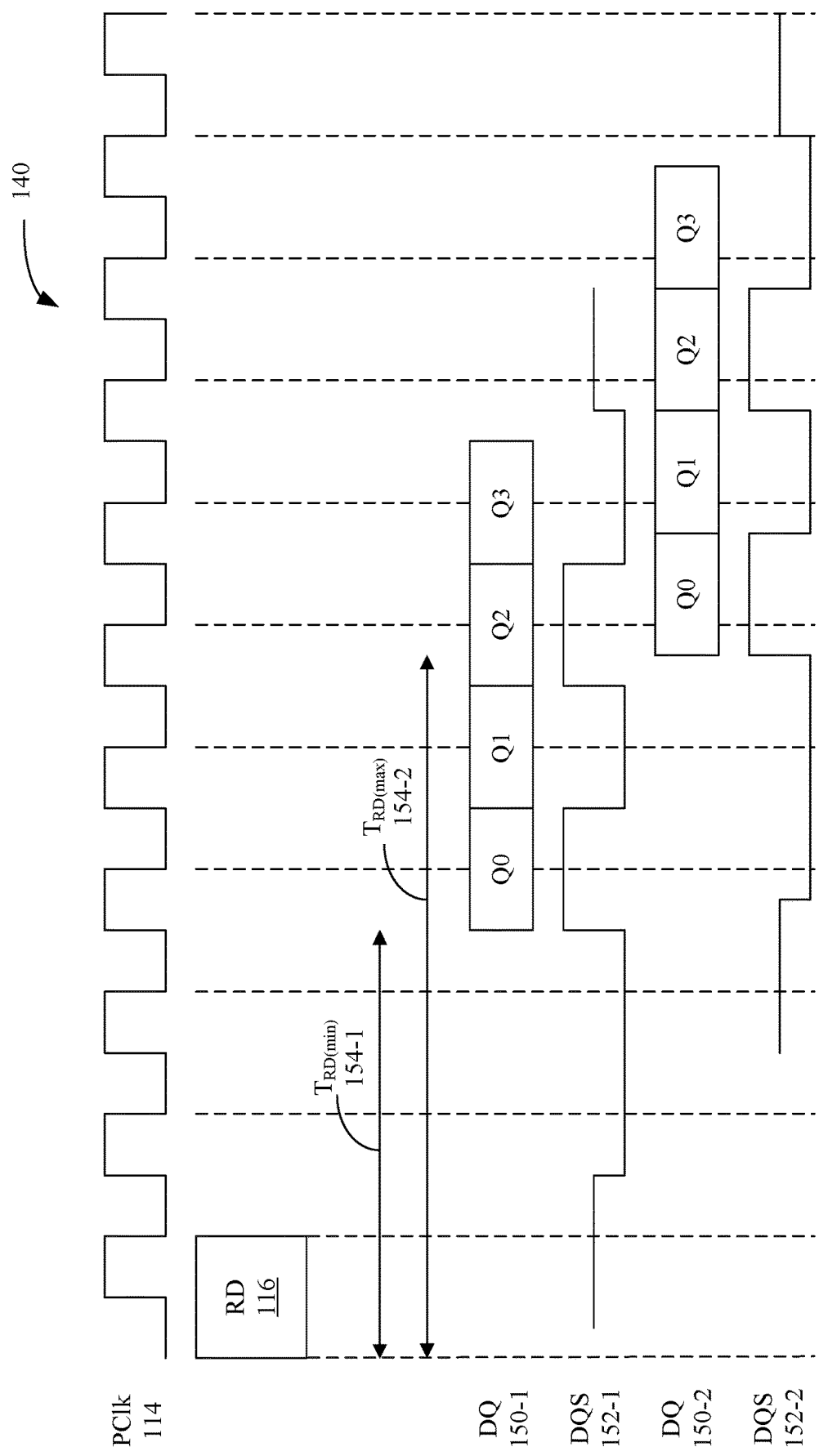
FIGS. 1B and 1C are exemplary timing diagrams for the system shown in FIG. 1A.

As discussed previously, delays may occur at various components and locations along this communication path, and these delays may vary and/or change based on processing conditions, as well as due to changes in temperature and/or one or more supply voltages. This is illustrated in FIG. 1B, which provides a timing diagram 140 for data (DQ) 150 and corresponding data strobes (DQS) 152. Note that each transition in the data strobes 152 is associated with corresponding data 150. Also note that in some embodiments, four data bits or symbols are transmitted with each data strobe signal 152. In other embodiments, the number of data bits or symbols transmitted with each data strobe signal 152 may be more than four (e.g., eight) or less than four. As illustrated in the timing diagram 140, round trip delays T vary between minimum 154-1 and maximum values 154-2, which may be several cycles of the clock signal 114 in the clock domain of the memory controller 110 (FIG. 1A).

In addition to global delays that apply to both the data 150 and the data strobes 152, there may also be relative delays. In some systems, these relative delays may be more than 1 cycle of the clock signal 114. This is illustrated in the timing diagram 160 shown in FIG. 1C. Timing drift 176 may occur between data 150-3 and data strobe 152-3. This drift 176 may complicate detection of the data 150-3 and/or result in data errors.

In particular, detection circuitry in the memory controller 110 (FIG. 1A) may generate additional signals, such as a data strobe internal (dqs_int) 170 and enable signal (dqs_en) 172. Data strobe internal 170 may include multiple zeros and ones even when read data is not being received. These spurious zeros and ones may occur because, at these times, the data strobe is parked or set at an intermediate voltage near the switching point of the receive circuits 118-1 (FIG. 1A) and 118-2 (FIG. 1A). As a consequence, factors such as coupled noise may give rise to transitions on data strobe internal 170. A timing window corresponding to the enable signal 172 may be used to clean up or eliminate these spurious zeros and ones to generate a clean version of the data strobe (dqs_clean) 174, which may be used to detect the data 150-3. Thus, in order to receive the data 150-3, the detection circuitry synchronizes the data strobe 152-3 and the enable signal 172, i.e., reduces and/or eliminates a timing offset between these signals. This synchronization may be performed one or more times, such as after a predetermined time interval or dynamically (i.e., continuously).

Figure 1C:
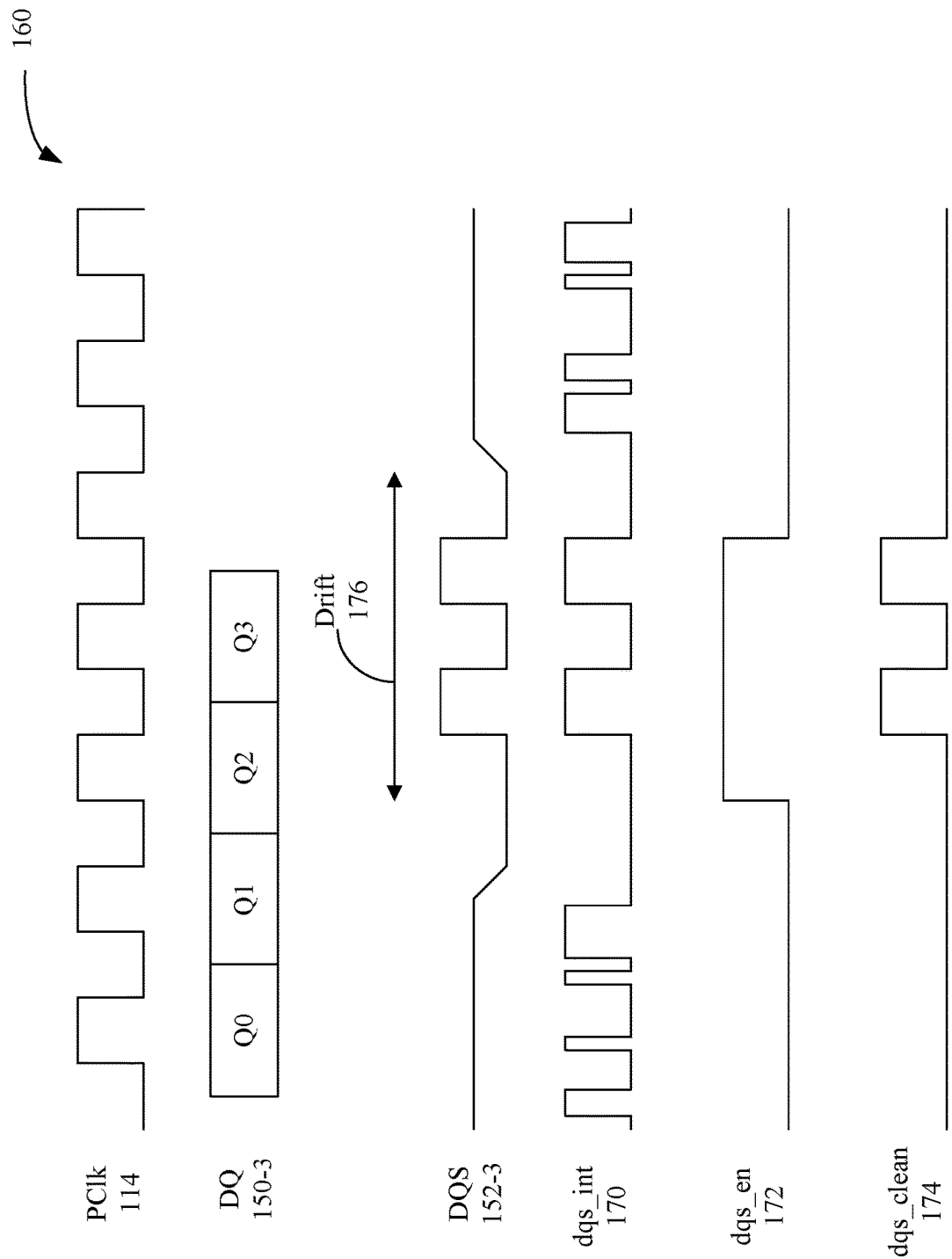

Referring back to FIG. 1A, the detection circuitry in the memory controller 110 may include comparison circuit 134 and control logic 136. The comparison circuit 134 may determine the timing offset between the read data, the data strobe signal, and/or internal signals such as the enable signal 172 (FIG. 1C). The control logic 136 may select a mode of operation of the memory controller 110. In a first mode of operation the memory controller may acquire and track the data strobe signal, while in the second mode of operation the memory controller may maintain synchronization between the read data and the data strobe signals. The control logic 136 may switch between the first mode of operation and the second mode of operation based, either directly or indirectly, on drift or changes in a timing offset, such as the offset between the data strobe 152-3 (FIG. 1C) and the enable signal 172 (FIG. 1C). For example, the control logic 136 may select the second mode of operation if the timing offset in the first mode of operation is less than a predetermined value, such as one half of a cycle of the clock signal 114. Alternatively, the control logic 136 may select the first mode of operation based on a read data error associated with the timing offset. Or the control logic 136 may select the first mode of operation if the timing offset in the second mode of operation exceeds a predetermined value, such as one half of a cycle of the clock signal 114.

As is also discussed further below, the detection circuitry in the memory controller 110 may be able to synchronize one or more of these signals with one another even when an initial timing offset is greater than ±1 or more cycles of the clock signal 114. In particular, adjustment, such as dynamic adjustment, of the timing offset between the data strobe 152-3 (FIG. 1C) and the enable signal 172 (FIG. 1C) may approximately center the data strobe signal 152-3 (FIG. 1C) in a window corresponding to the enable signal 172 (FIG. 1C). Embodiments of such circuits for performing these adjustments are described further below with reference to FIGS. 3-6.

In embodiments where the adjustment is dynamic, a minimum read command density or rate may be needed. In particular, since the adjustment only occurs when a read data is received by the memory controller 110, if read commands are issued infrequently excessive timing drift may occur. For example, the timing drift may have a time constant that is associated with thermal and/or voltage changes, and if read commands are issued on a time scale longer than this time constant, excessive timing drift may result. In some embodiments, therefore, the control logic 136 may issue one or more supplemental read commands to the memory device 124 if a time interval since a last read command exceeds a predetermined value. In an exemplary embodiment, the predetermined value is between approximately 10 ms and approximately 100 ms. Furthermore, in some embodiments at least two consecutive read commands are issued by the memory controller 110 during the first mode of operation. This is discussed below with reference to FIGS. 6A and 6B.

In some embodiments, the system 100 may include fewer or additional components, logical positions of one or more components may be changed, and two or more of the components may be combined and/or shared. For example, in some embodiments there may be one or more additional memory controllers and/or one or more additional memory devices. In some embodiments, the memory device 124 includes control logic.

Figure 2A:
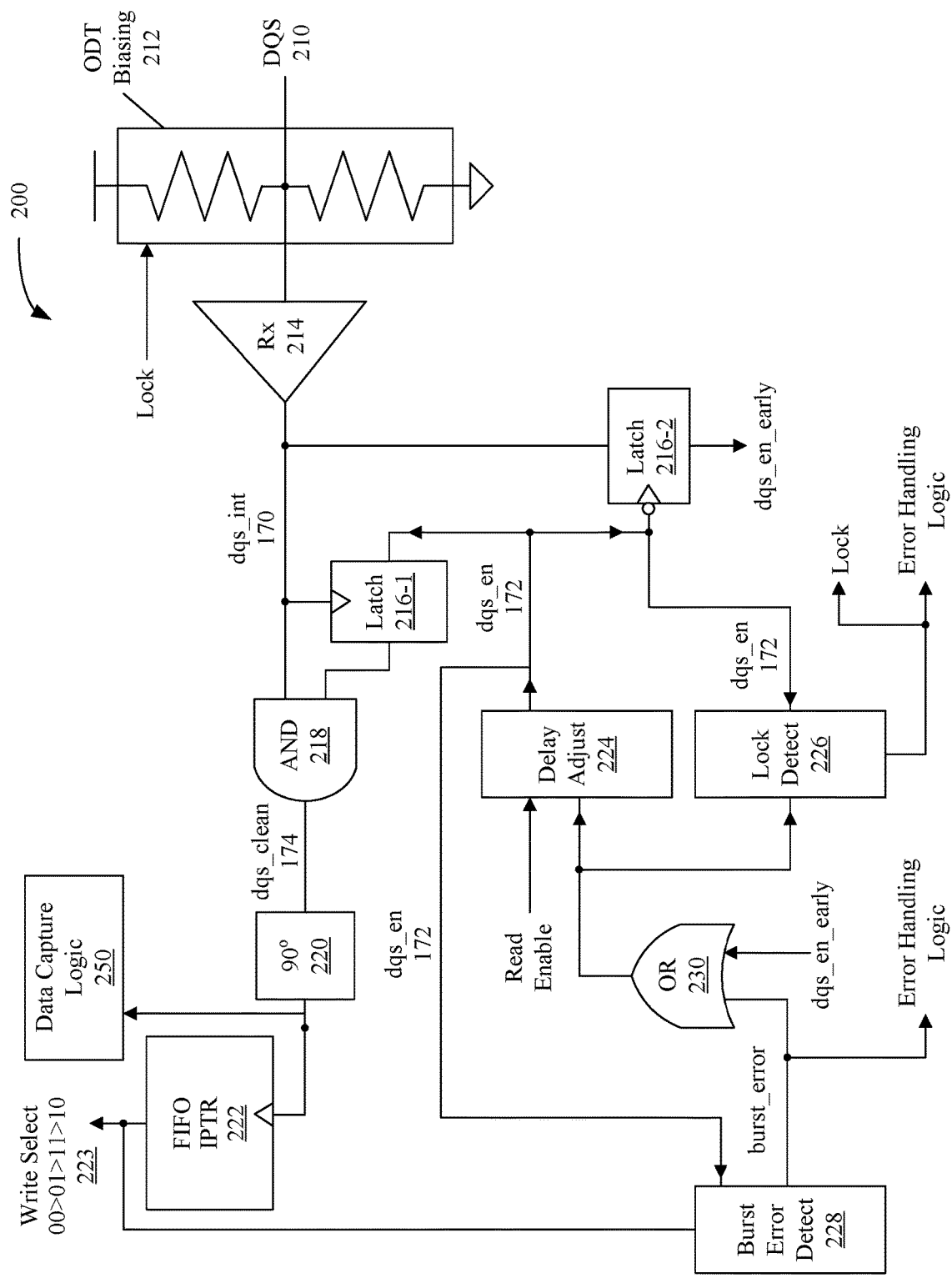
FIG. 2A is a block diagram illustrating an embodiment of a circuit.

FIG. 2A is a block diagram illustrating an embodiment of a circuit 200 that may be included in the memory controller 110 (FIG. 1A). The circuit 200 includes detection circuitry to synchronize the strobe enable signal 172 and data strobe 210 during the first and/or the second mode of operation. The circuit 200 locks the negative or falling edge of the enable signal 172 with the last falling edge of the data strobe 210. The phase of the data strobe 210 is sampled at the falling edge of the enable signal 172 (see latch 216-2). The samples indicate if the data strobe 210 is early or late (high or low). In some embodiments, this occurs if the timing offset is within ±1 bit time (±0.5 cycles of the clock signal 114 in FIG. 1A) of the target timing offset. As discussed below with reference to FIGS. 4-5, if the timing offset is larger than this range, in some embodiments additional circuits are used during the first mode of operation to achieve this level of tracking accuracy. The circuit 200 also uses data strobe burst error information, which is defined as any time a memory read is completed and a data strobe edge counter did not count two positive or rising edges in the data strobe 210. A relative delay between the strobe enable signal 172 and the data strobe 210 is determined based on the combination of the burst error information and the data strobe sample information. In particular, the delay of the strobe enable signal 172 is increased if the burst error or the data strobe sample are high (i.e., the early condition), and decreased if the burst error and the data strobe sample are low (i.e., the late condition). A feedback loop described below is updated at the end of a sequential read burst, i.e., at the falling edge of the enable signal 172. This ensures that adjustment of the delay occurs when read traffic is not present.

In the circuit 200, the data strobe 210 is received on a node in an interface and is coupled to on-die termination (ODT) biasing circuit 212 and receive circuit 214. As described further below with reference to FIG. 2A, in some embodiments the on-die termination biasing circuit 212 biases a voltage level in the interface during the first mode of operation based on a lock signal that is provided by lock detect circuit 226. This biasing may shift the data strobe 210 waveform and remove noise-induced edges during initial acquisition, i.e., during the first mode of operation. An output from the receive circuit 214 is the data strobe internal signal 170 (dqs_int). This signal is coupled to latch 216-2 and AND gate 218. It is also used to clock latch 216-1.

Delay adjust circuit 224 outputs the enable signal 172 when read enable is asserted or is logical high. As discussed below with reference to FIG. 2D, the delay adjust circuit 224 provides the appropriate delay or timing offset to synchronize the data signal and the data strobe 210. In an exemplary embodiment, the delay adjust circuit 224 provides delays up to 3.875 cycles of the clock signal 114 (FIG. 1A) in steps of ⅛ of a cycle. The enable signal 172 is coupled to the AND gate 218 by the latch 216-1 on the rising edges of the data strobe internal signal 170. The enable signal 172 is also coupled to the latch 216-2, the lock detect circuit 226, and burst error detect circuit 228.

The output from gate 218 is the clean version of the data strobe 174, dqs_clean. Delay element 220 provides a 90° phase shift, which approximately centers the transitions in the clean version of the data strobe 174 in the middle of a bit cell or half cycle of the clock signal 114 (FIG. 1A), i.e., in the middle of the data eye pattern. The output from the delay element 220 is coupled to data capture logic 250 and to FIFO IPTR Counter 222. FIFO IPTR Counter 222 counts the edges in the clean version of the data strobe 174, and outputs a Write Select signal 223 that is a repeating sequence of gray codes: 00, 01, 11, 10 (which then repeats), incrementing the gray code in response to each upward transition of the clean strobe signal dqs_clean 174. Write Select 223, output from the FIFO IPTR Counter 222, directs the writing of received data (received in parallel with the strobe signal) into the slots of a FIFO buffer (not shown). Write Select 223 is also coupled to the burst error detect circuit 228.

As described below with reference to FIG. 2C, the burst error detect circuit 228 determines if a burst error has occurred in the data strobe 210 based on the Write Select signal 223. In particular, if the data strobe 210 is appropriately centered in the window corresponding to the enable signal 172, the clean strobe signal will have four edges, including two rising edges, during each data burst (FIG. 1B). If this is not the case, a burst error is asserted on the output from the burst error detect circuit 228 (burst error), which is coupled to OR gate 230 and error handling logic. The error handling logic may be included in the control logic 136 (FIG. 1A), and may be used to control the acquisition process. For example, in response to assertion of a burst error, the memory controller 110 (FIG. 1A) may issue another or supplemental read command.

The latch 216-2 samples the data strobe 210 at the falling edges of the enable signal 172 in order to determine if the data strobe 210 is early or late relative to the window. Referring to FIG. 1C, if the falling edge of the enable signal dqs_en 172 coincides with the internal strobe signal dqs_int at a low state, this indicates that the entire strobe signal falls within the enable window. This is called "the late condition" because the end of the enable window is later than the end of the internal strobe signal, as it should be during normal operation. On the other hand, if the falling edge of the enable signal dqs_en 172 coincides with the internal strobe signal dqs_int at a high state, this is called "the early condition"

because the enable window ends earlier than the end of the strobe signal. The output from the latch 216-2 (dqs_en early) is received at an input of the OR gate 230.

The delay provided by the delay adjust circuit 224 is updated and/or modified based on the output from the OR gate 230 (which, in turn, depends on the outputs from the burst error detect circuit 228 and the latch 216-2). Thus, the delay adjust circuit 224 provides closed loop feedback. In some embodiments, this feedback is based on a combination of data strobe error and data strobe position information, and is used to adjust the phase or timing of the enable signal 172 window relative to the data strobe signal. As discussed previously, in these embodiments the delay of the enable signal 172 is increased if the burst error (burst error) or the data strobe sample (dqs_en early) are high (i.e., the early condition), and decreased if the burst error (burst error) and the data strobe sample (dqs_en early) are both low (i.e., the late condition).

The lock detect circuit 226 determines if synchronization has been achieved (i.e., if the timing offset is less than one-half of a cycle of the clock signal 114 in FIG. 1A) based on the output from the OR gate 230 and the enable signal 172. The lock detect circuit 226 outputs the lock signal to the on-die termination biasing circuit 212 and the error handling logic. In particular, if synchronization is achieved, in some embodiments the lock signal returns the on-die termination biasing circuit 212 to normal operation.

Figure 2B:
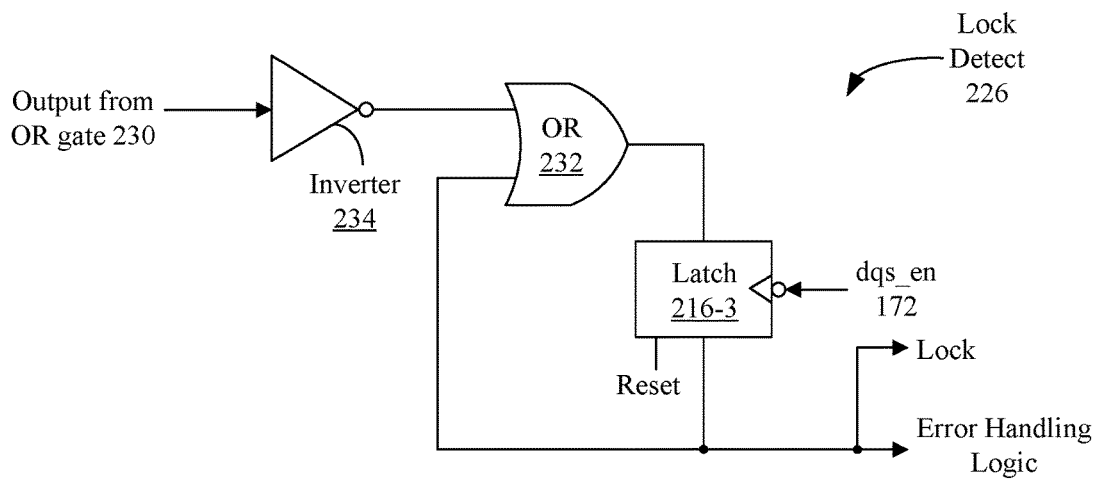
FIG. 2B is a block diagram illustrating an embodiment of a lock detect circuit.

FIG. 2B is a block diagram illustrating an embodiment of the lock detect circuit 226. The output from the OR gate 230 (FIG. 2A) is inverted by inverter 234, and the resulting inverted signal is coupled to an input of OR gate 232. Latch 216-3 couples this signal back to the OR gate 232 based on the falling edges of the enable signal 172. If the output from the OR gate 232 (FIG. 2A) is low, i.e., the data strobe 210 is neither early nor late and a burst error is not asserted, then the output of the OR gate 232 will be high, corresponding to a lock or synchronization condition. Latch 216-3 is reset to an initial state when a Reset signal is asserted (e.g., by a processor or control logic in the memory controller).

Figure 2C:
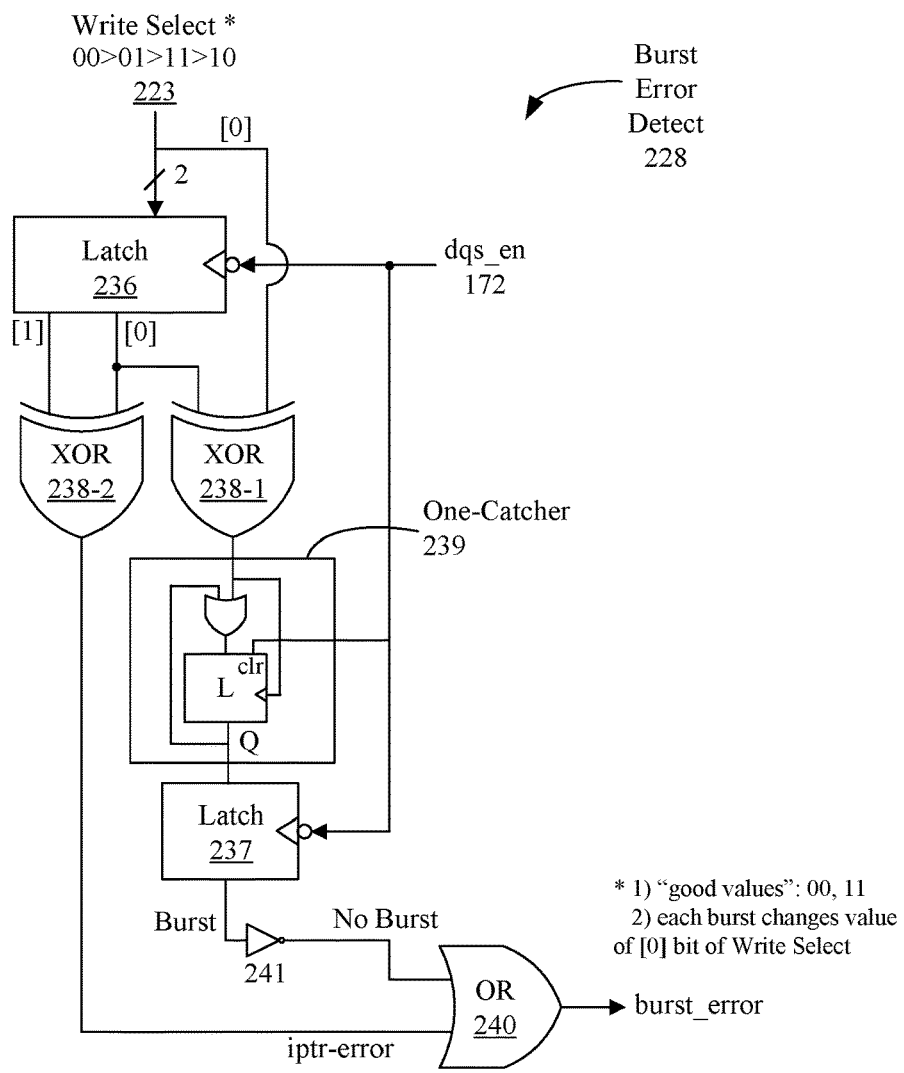
FIG. 2C is a block diagram illustrating an embodiment of a burst error detect circuit.

FIG. 2C is a block diagram illustrating an embodiment of a burst error detect circuit 228. The two bit Write Select 223 (FIG. 2A) is stored in a latch 236, which is clocked at the end of each enable window by a downward transition of the enable signal dqs_en 172. The remainder of the burst error detect circuit 228 can be divided into two branches: a left branch and a right branch. The left branch determines if the final value of Write Select 223 at the end of the enable window is a legal value (00 or 11). If the latched Write Select is a legal value, iptr-error is set to 0, and if the latched Write Select is an illegal value iptr-error is set to 1. This function is accomplished by an XOR gate 238-2, which exclusive-OR's the [0] and [1] bits of the latched Write Select.

The right branch of the burst error detect circuit 228 determines if Write Select 223 advanced from one value to another during the last enable window. In particular, the right branch generates a Burst signal that is equal to 1 if Write Select 223 advanced from one value to another during the last enable window (i.e., one or more data strobes were received during the enable window). An OR gate 240 logically OR's the inverse of the Burst signal and the iptr-error signal to produce a burst error output signal, which is equal to a logical "1" if a burst error has occurred. In other words, if a burst error has occurred, the output from the burst error detect circuit 228 is asserted.

In one embodiment, the Burst signal is produced as follows. An XOR gate 238-1 exclusively-OR's the [0] bit of the current Write Select 223 and the [0] bit of the latched Write Select. The output of the XOR gate 238-1 is equal to 1 if its inputs differ in value, which means that the output of the XOR gate 238-1 is equal to 1 if Write Select has advanced to a new value since the end of the last enable window. A One-Catcher circuit 239 detects if the output of the XOR gate 238-1 is equal to 1 anytime during an enable window. It does this by outputting a 1 if a 1 is detected on the output of the XOR gate 238-1. At the end of each enable window, the output of the One-Catcher 239 is stored in latch 237 and the One-Catcher 239 is reset. The One-Catcher 239 includes a latch that captures the input of the One-Catcher 239 whenever the input transitions from a 0 to a 1. The latch of the One-Catcher 239 is cleared when the enable window is inactive (e.g., dqs_en is 0).

The output of latch 237 is the aforementioned Burst signal, which is equal to 1 if Write Select changed in value at least once during the prior enable window. An inverter 241 inverts the Burst signal to produce a No Burst signal that is logically OR'ed with the iptr-error signal by OR gate 240 to produce the output of the burst error detect circuit 228, burst error.

Figure 2D:
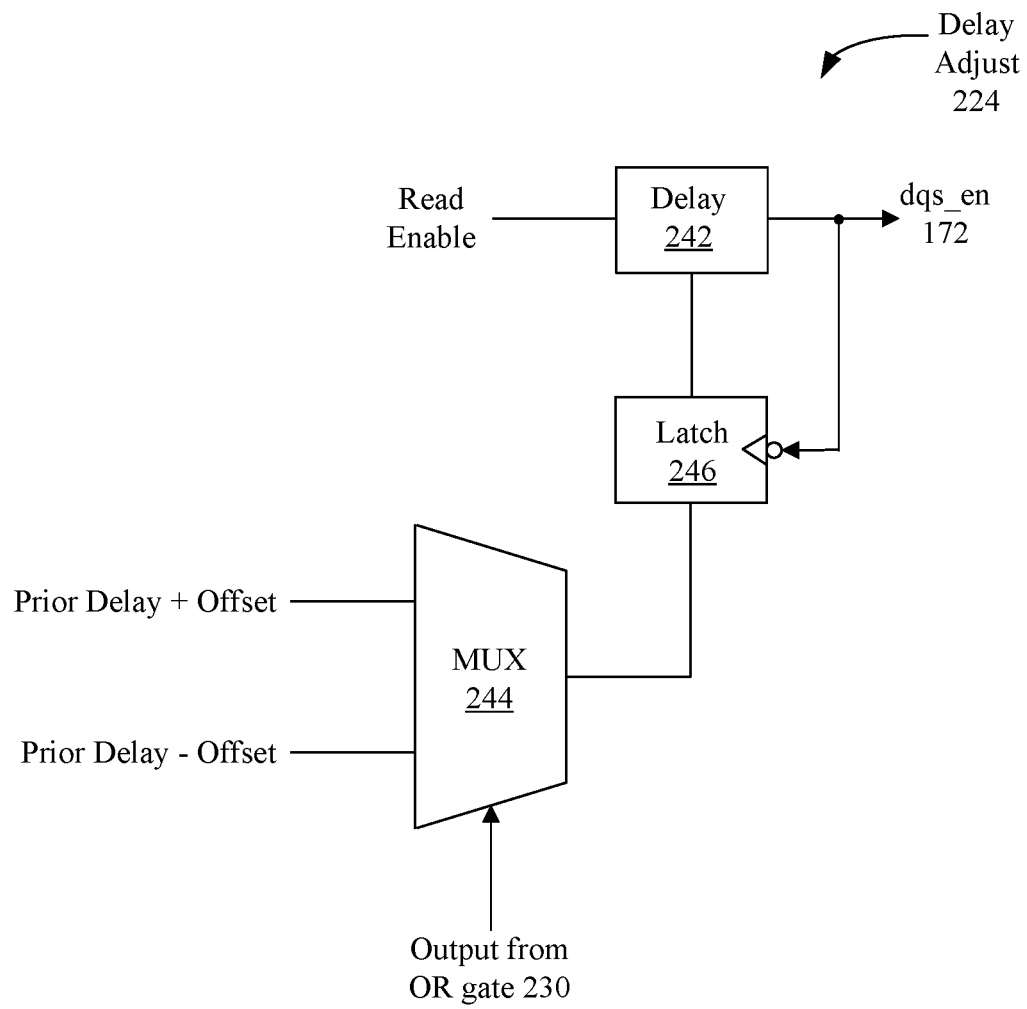
FIG. 2D is a block diagram illustrating an embodiment of a delay adjust circuit.

FIG. 2D is a block diagram illustrating an embodiment of a delay adjust circuit 224. If the output from the OR gate 230 (FIG. 2A) is high, the prior delay value plus a positive offset is applied by multiplexer (MUX) 244 to latch 246 (i.e., the delay produced by delay element 242 is increased). And if the output from the OR gate 230 is low, a negative offset is applied by multiplexer 244 to latch 246 (i.e., the prior delay produced by delay element 242 is decreased by an offset). The latch 246 updates or modifies the setting of delay element 242 (for example, a stored register value) at the end of each enable window (i.e., at the falling edges of the enable signal 172). In this way, the feedback results are applied to the next data strobe. The delay element 242 outputs the enable signal 172 when read enable is high or is asserted.

In some embodiments, the circuit 200, the lock detect circuit 226, the burst error detect circuit 228, and/or the delay adjust circuit 224 may include fewer or additional components, logical positions of one or more components may be changed, and two or more of the components may be combined and/or shared. For example, in some embodiments the circuit 200 may not include the burst error detect circuit 228, the OR gate 230, and the lock detect circuit 226. Furthermore, in another embodiment the sampling time of the data strobe 210 is adjustable. And in another embodiment, the on-die termination biasing circuit 212 during acquisition (i.e., during the first mode of operation) is optimized using an additional control loop.

Figure 3A:
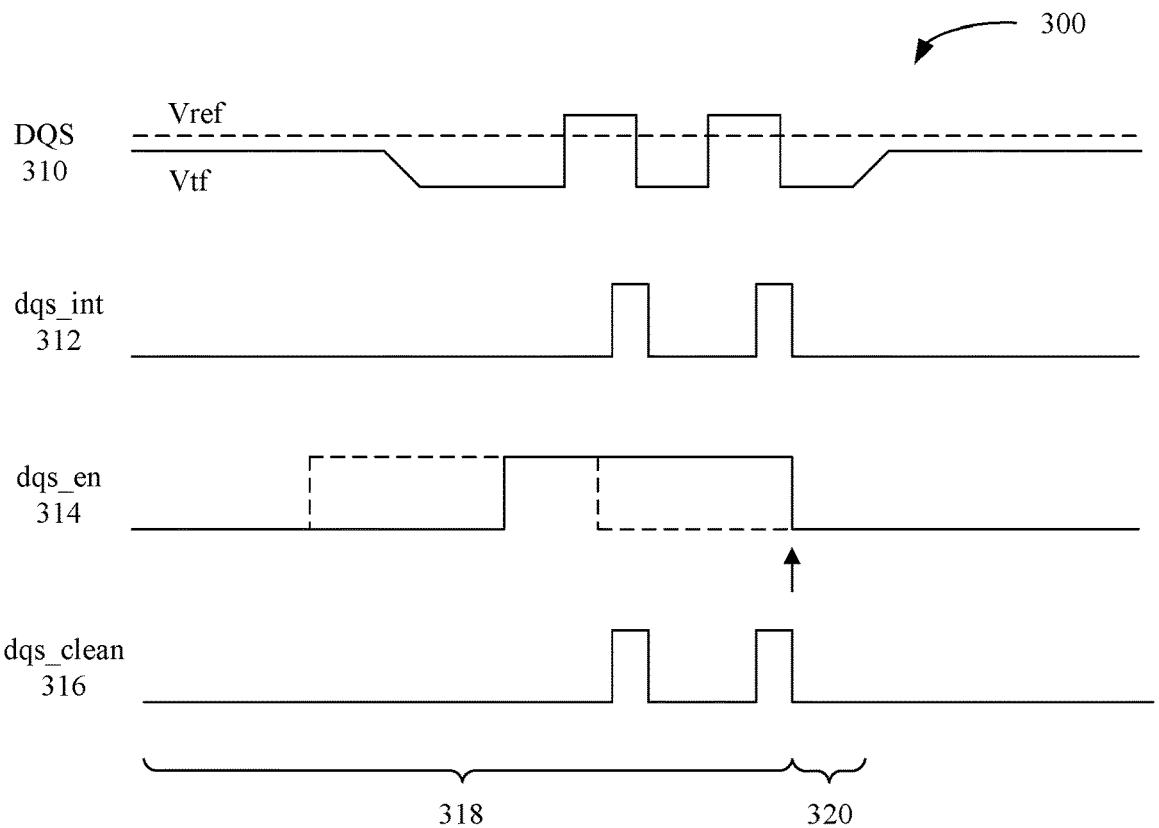
FIGS. 3A and 3B are exemplary timing diagrams for the circuit shown in FIG. 2A.

We now discuss several embodiments of locking techniques that may be used in the first and/or the second mode of operation. FIG. 3A shows a timing diagram 300 related to the operation of the circuit shown in FIG. 2A. During the first mode of operation, a voltage reference $V_{ref}$, illustrated by the dashed line, that defines a voltage level in the interface is biased, for example, using the on-die termination biasing circuit 212 (FIG. 2A). This shifts the input data strobe 310 waveform ($V_{tf}$) down and removes or reduces noise induced edges from data strobe internal 312. However, the data strobe internal 312 and clean version of the data strobe 316 are now asymmetric and have distorted edges.

A minimum value of the timing offset or delay of enable signal 314 in the delay adjust circuit 224 (FIG. 2A) is initially used. Two or more non-continuous read commands are issued by the memory controller 110 (FIG. 1A). Note that during this acquisition phase the actual read data is not important. In some embodiments, the delay is progressively increased, thereby shifting the enable signal 314 to the right until the delay is decreased for the first time (i.e., the enable signal 314 has overshot the target timing offset or delay). In other embodiments, the delay is progressively increased, thereby shifting the enable signal 314 to the right until four edges in the data strobe internal 312 are counted. Note that timing ranges 318 and 320 of delay adjustment in the timing diagram 300 reflect the initial use of a minimum delay setting for the timing offset. Once the delay has been reduced for the first time, or the four edges of the data strobe are counted, the on-die termination biasing circuit 212 (FIG. 2A) is returned to normal operation, and tracking in second mode of operation is used.

Figure 3B:
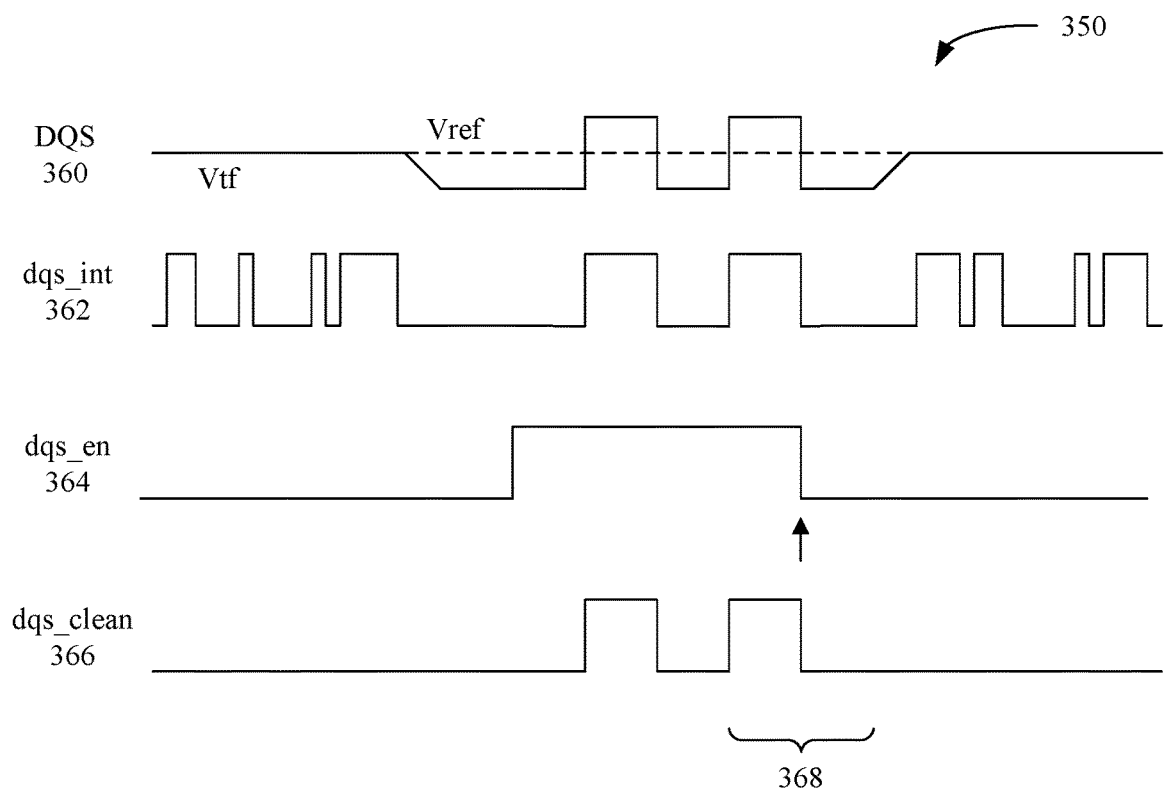
Figure 4:
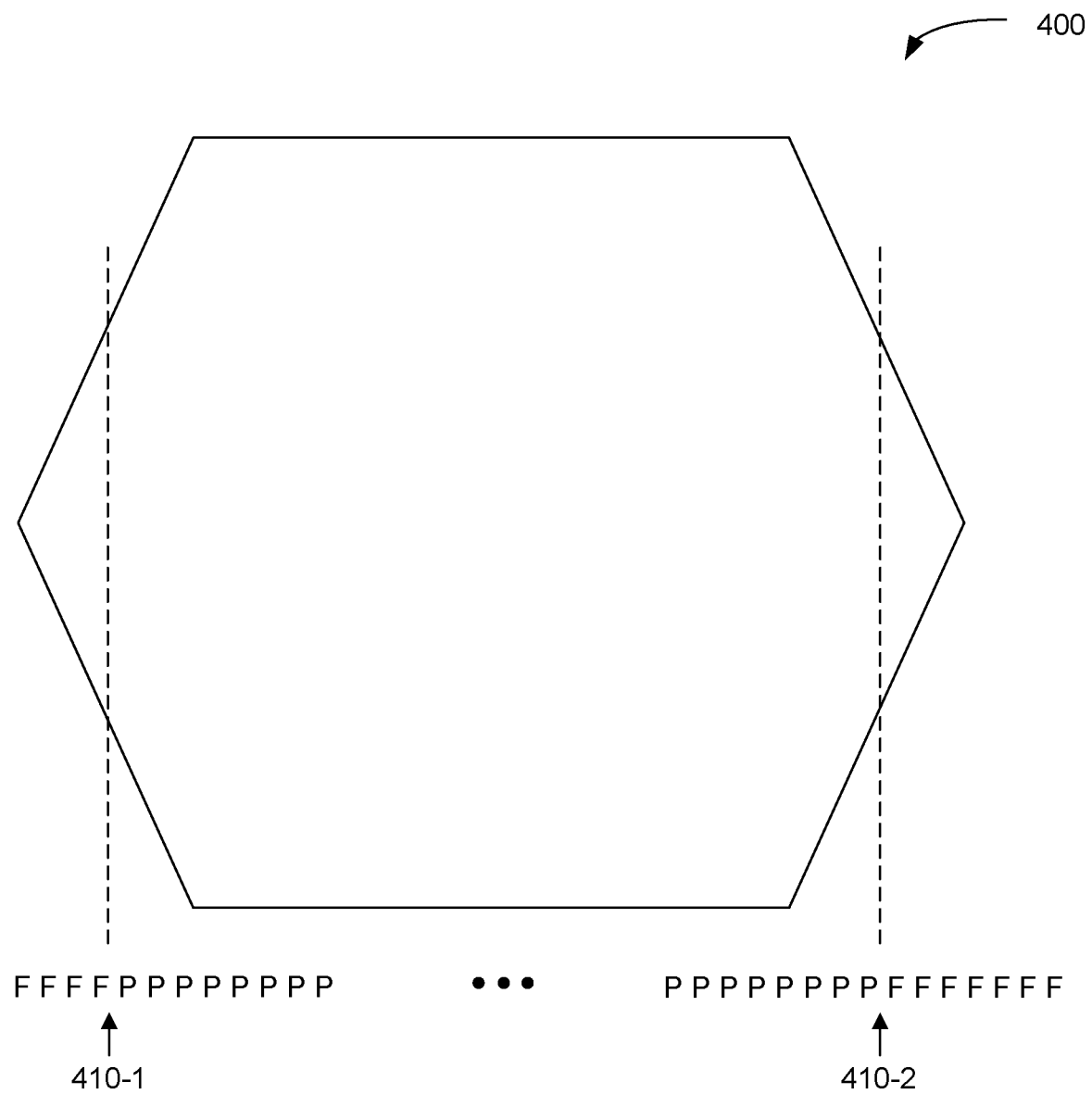
FIG. 4 schematically illustrates an eye pattern.

FIG. 3B is another exemplary timing diagram 350 for the circuit shown in FIG. 2A. The voltage reference $V_{ref}$ that defines the voltage level in the interface has been returned to its normal value, i.e., its value in the second mode of operation. Data strobe 360 waveform is shifted back up, resulting in noise edges on enable signal 362. However, the enable signal 362 and clean version of the data strobe 366 are now symmetric and no longer have distorted edges.

The tracking loop in timing diagram 350 is unchanged relative to timing diagram 300 (FIG. 3A). However, the read density must be adequate to prevent drift greater than ±1 bit time. Thus, the delay of enable signal 364 is adjusted (dithered) within timing region 368 about the target delay, which is indicated by the vertical arrow. If the delay exceeds this bound, the first mode of operation may be used again. In some embodiments, the output from the FIFO IPTR Counter 222 (FIG. 2A) is monitored and used to initiate error routine handling (e.g., transitioning to the first mode of operation) if the end of the enable window falls outside the timing region 368.

In other embodiments, a voltage level in the interface is not biased during the first mode of operation. Instead, a known or predefined data pattern (such as a pseudo-random sequence) may be used to lock the data strobe and the enable signal. For example, the delay or timing offset may be swept over a range of values (from early to late or from late to early) as the predefined data pattern is transmitted by the memory device 124 (FIG. 1A). The comparison circuit 134 (FIG. 1A) may compare the received data with either a stored version of the predefined pattern or a version of the predefined pattern that is generated in the memory controller 110 (FIG. 1A). When errors are detected, the pass-fail boundaries and corresponding delays are determined. This is illustrated by the eye pattern 400 in FIG. 4. At extrema (maximum or minimum) of the timing offset or delay, errors occur. These are indicated by pass-fail boundaries 410.

One or more of the pass-fail boundaries 410 may be used to determine a delay that corresponds to the desired lock condition. For example, the average of the delays at the pass-fail boundaries 410 may be used. This delay is approximately in the center of the eye pattern 400. Alternatively, once an edge in the data strobe is determined based on one of the pass-fail boundaries 410, a given offset may be added or subtracted to obtain the delay that is approximately in the center of the eye pattern 400. Once the appropriate delay is determined and lock has been acquired, the memory controller 110 (FIG. 1A) may transition to the second mode of operation and the tracking technique illustrated in the timing diagram 350 (FIG. 3B) may be used. Note that in some embodiments that utilize the approach illustrated in FIG. 4, the circuit 200 (FIG. 2A) may not include the burst error detect circuit 228 (FIG. 2A), the OR gate 230 (FIG. 2A), and/or the lock detect circuit 226 (FIG. 2A).

Figure 5A:
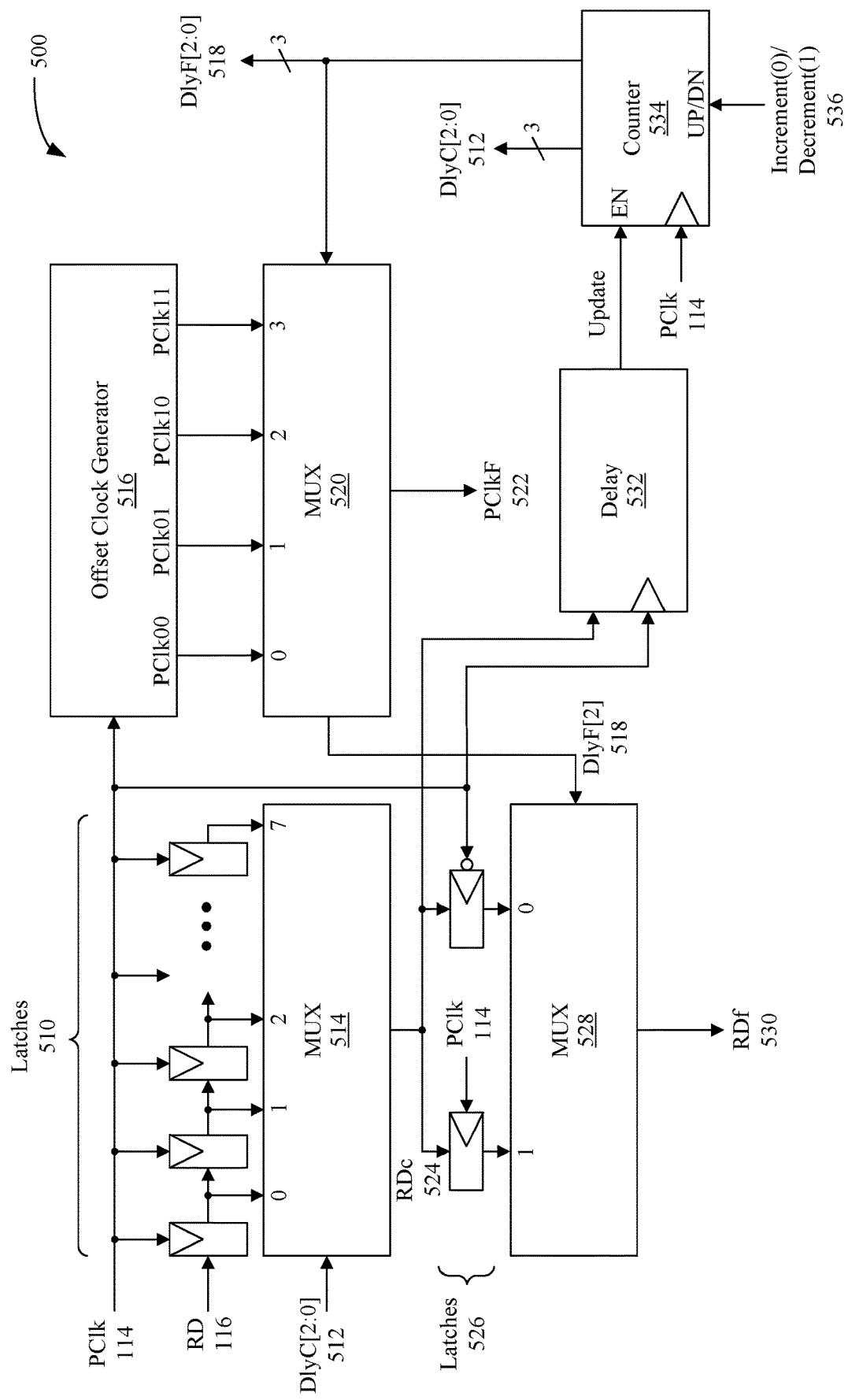
FIG. 5A is a block diagram illustrating an embodiment of a circuit.
Figure 5B:
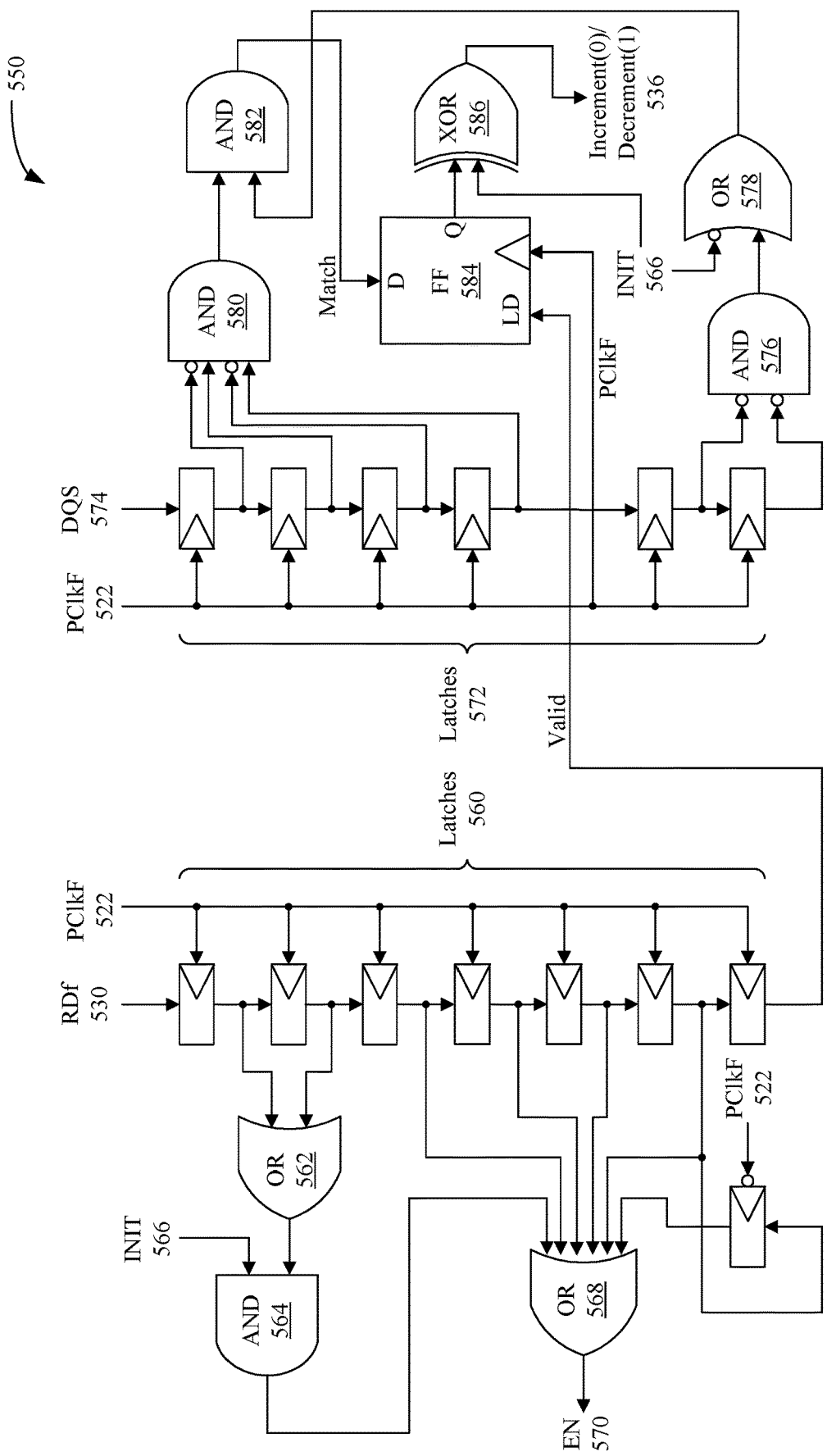
FIG. 5B is a block diagram illustrating an embodiment of a circuit.

In some embodiments, the timing offset is determined by comparing at least a portion of the received read data with a predefined pattern, for example, one that corresponds to a preamble of the data strobe. In these embodiments, therefore, the delay during the acquisition or first mode of operation is initially biased late (as opposed to early). FIGS. 5A and 5B are block diagrams illustrating embodiments of circuits 500 and 550 that utilize such an approach. The circuits 500 of FIG. 5A are in the PClk domain, while the circuits 550 of FIG. 5B are in the PClkF domain. In some embodiments, a single instance of circuit 500 and circuit 550 is shared by all the bits whose receipt is controlled by a single data strobe. All the signals shown in circuits 500 and 550 are single bit wide signals, unless otherwise indicated in the figures or the explanation below.

In the circuit 500, a counter 534 is initially set to maximum value, i.e., which corresponds to a maximum delay between the read command RD 116 and the beginning of the enable signal window EN (see FIGS. 6A-6D). The counter outputs a coarse delay (DlyC) 512 and a fine delay (DlyF) 518, and together these two values represent a variable delay. A maximum difference between the initial value of the variable delay (set at the beginning of the first mode of operation) and a final value of the variable delay (at the end of the first mode of operation, which occurs when a match is detected between the data strobe and a predefined data strobe pattern) is typically more than two clock cycles of the PClk signal. This enables the receiving device to be able to handle very large variations in the read cycle round trip timing.

Latches 510 are used to provide delayed versions of the read command 116 to multiplexer 514. A respective delayed version of the read command, referred to as RDc 524, is output by the multiplexer 514 based on the coarse delay DlyC[2:0] 512. Latches 526 provide delayed and un-delayed versions of RDc 524 to skip multiplexer 528. The output from the skip multiplexer 528, which is referred to as RDf 530, is selected based on the fine delay DlyF 518 (e.g., the most significant bit DlyF[2] of the fine delay).

Offset clock generator 516 provides four clock signals (PClk00, PClk01, PClk10, PClk11) having different phase offsets relative to the PClk clock signal 114. PClk00, PClk01, PClk10, and PClk11 are delayed with respect to the PClk signal by 0, 0.25, 0.5, and 0.75 clock cycles, respectively. The four clock signals are coupled to multiplexer 520. The multiplexer 520 outputs a clock with a respective phase, which is referred to as PClkF 522, based on the value of the fine delay DlyF 518 (e.g., based on least significant bits DlyF[1:0] of the fine delay).

RDc 524 (i.e., the appropriately delayed version of the asserted read command) is also used to enable an update of the counter 534 after being delayed by delay element 532. This delay ensures that updates occur when read traffic is not present. In an exemplary embodiment, the minimum read burst size is four clock cycles (of PClk 114) in length and the delay element 532 corresponds to ten cycles of the clock signal 114. Note that the components illustrated in the circuit 500 are clocked using the clock signal 114, i.e., they are in the PClk domain. The components in the circuit 550, however, are clocked using PClkF 522, i.e., they are in the PClkF domain. As discussed further below, the phase of the PClkF domain tracks the phase of the data strobe.

Referring to FIG. 5B, the circuit 550 has two modes of operation. In the first mode of operation, INIT 566 is asserted and the delay (DlyC and DlyF) is initially set to its maximum possible value. Latches 560 in conjunction with OR gates 562 and 568 and AND gate 564 provide enable signal (EN) 570, which defines the enable window. When any of the inputs to OR gate 568 is a logical 1, the OR gate 568 sets the enable signal 570 to a logical 1. The enable signal 570 window in the first mode of operation is 10.5 clock cycles wide. This is accomplished by issuing two back-to-back transactions, each with four cycles of data, with 1.5 cycles of preamble and 1.0 cycles of post-amble.

Latches 572 in conjunction with OR gate 578, AND gates 576, 580 and 582, flip-fop (FF) 584, and XOR gate 586 compare data strobe 574 with an expected or predefined pattern (e.g., 001010, where the left most bit of this pattern is the first or oldest bit of the pattern). In the first mode of operation, the comparison is based on six samples. The XOR gate 586 outputs an increment/decrement signal 536 to the counter 534 (FIG. 5A). In the embodiment shown in FIGS. 5A and 5B, signal 536 indicates "increment" or "up" when the signal 536 is equal to 0 and indicates "decrement" or "down" when the signal 536 is equal to "1". Since the delay is initially set to the maximum value, in the first mode of operation the circuit 550 will progressively decrease the delay until a lock condition is acquired. More specifically, in the first mode of operation, INIT=1, which causes the XOR gate 586 to output an increment/decrement signal 536 that is equal to the Match signal (which is a logical 1 when the strobe signal matches the predefined pattern). Thus, in the first mode of operation, the increment/decrement signal 536 is set to decrement (i.e., to a logical 1) whenever the strobe signal DQS 574 does not match the predefined pattern (i.e., when Match=0).

Once the lock is acquired, the circuit 550 switches to a second mode of operation in which INIT 566 is set low (INIT=0). In some embodiments, the first several read cycles in the second mode of operation are used to adjust the strobe enable window to the dither point, after which normal data operations can begin. In other embodiments, normal data transmission can begin as soon as the circuit 550 switches to the second mode of operation. In the following discussion, FIGS. 6C and 6D are timing diagrams representing the first few read cycles after entering the second mode of operation, while FIG. 6E represents normal operation after the dither point has been reached. The transition from the "adjust timing" sub-mode to the "normal" sub-mode of operation (both of which are sub-modes of the second mode of operation and have INIT=0) occurs when the increment/decrement signal 536 equals "increment" for the first time while in the second mode of operation.

In the second mode of operation, the width of the enable signal 570 is 4.5 clock cycles, and the comparison of the data strobe 574 with the predefined pattern utilizes four samples (e.g., 1010) instead of six. In this mode of operation, the feedback loop adjusts the delay (dithers) about the target delay value. When there is a pattern match (Match=1), the delay is decreased, and when there is no pattern match (Match=0) the delay is increased. As in the other embodiments described previously, if excessive drift occurs (i.e., the lock condition is not maintained to within ±1 bit time), the memory controller 110 (FIG. 1A) may switch the circuit 550 to the first mode of operation to reacquire the proper delay or phase setting for the strobe enable signal.

In some embodiments, the circuits 500 (FIG. 5A) and/or 550 include fewer or additional components, logical positions of one or more components may be changed, and two or more of the components may be combined and/or shared.

Figure 6A:
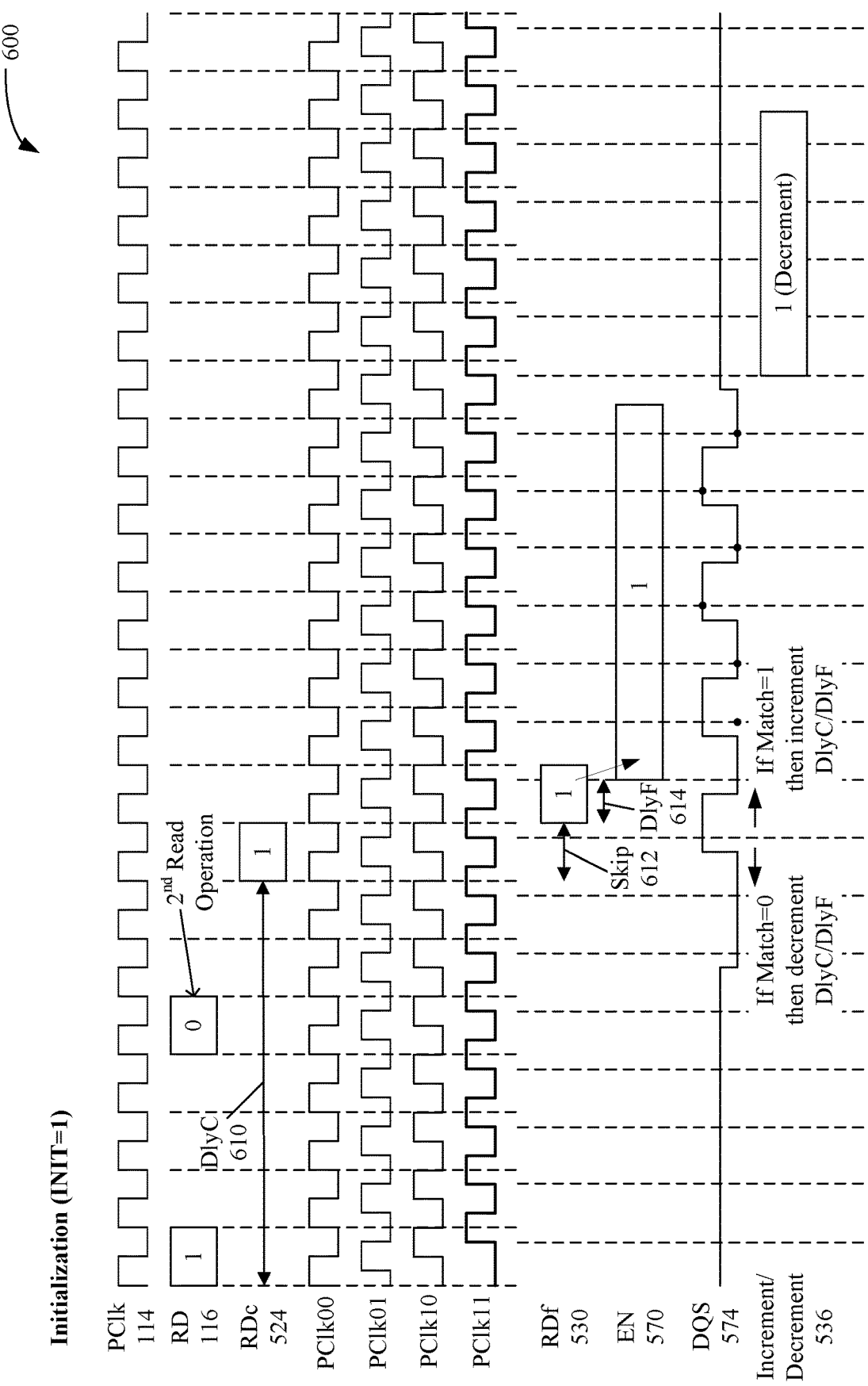
FIGS. 6A, 6B, 6C, 6D and 6E are exemplary timing diagrams for the circuits shown in FIGS. 5A and 5B.
Figure 6B:
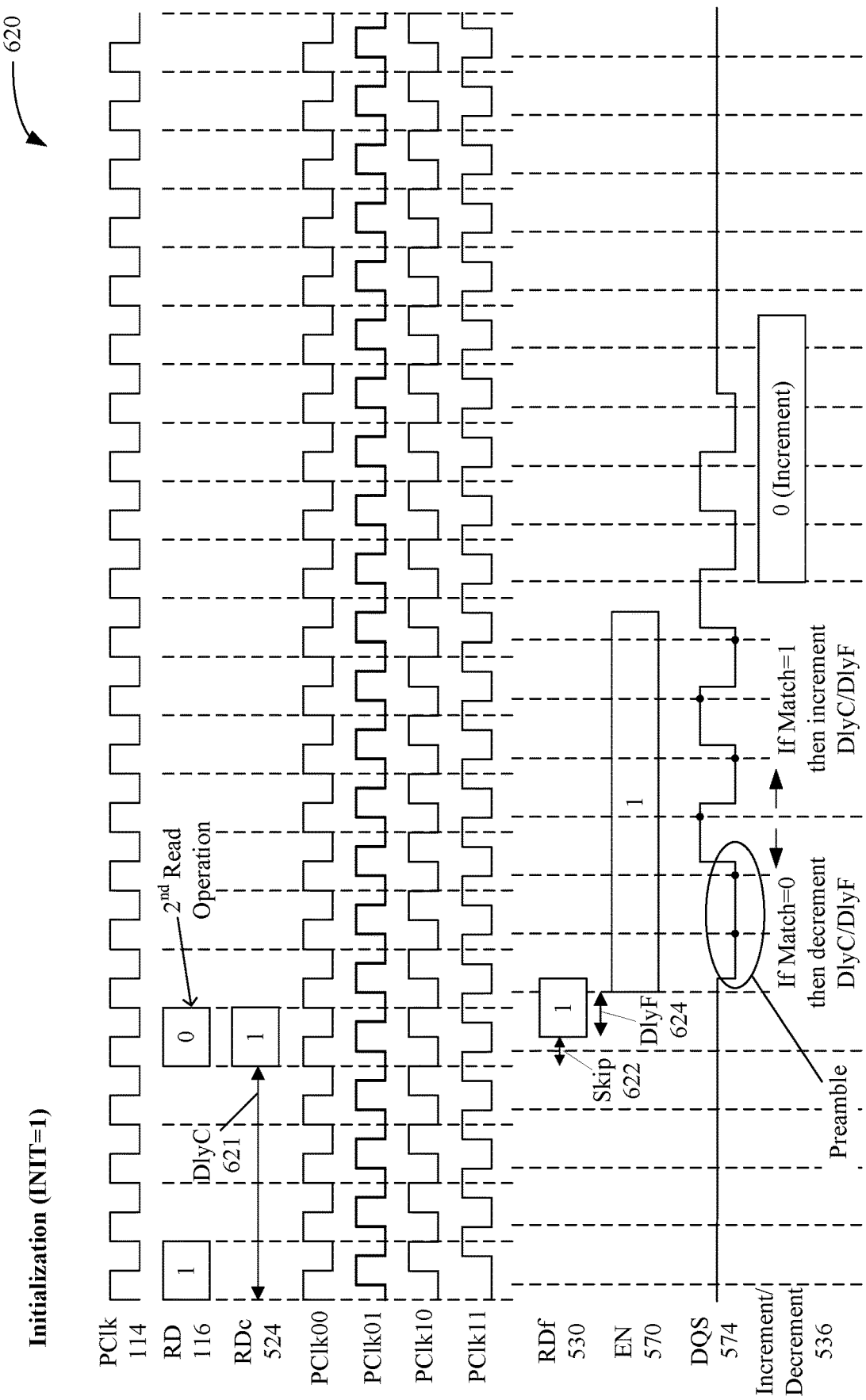
Figure 6C:
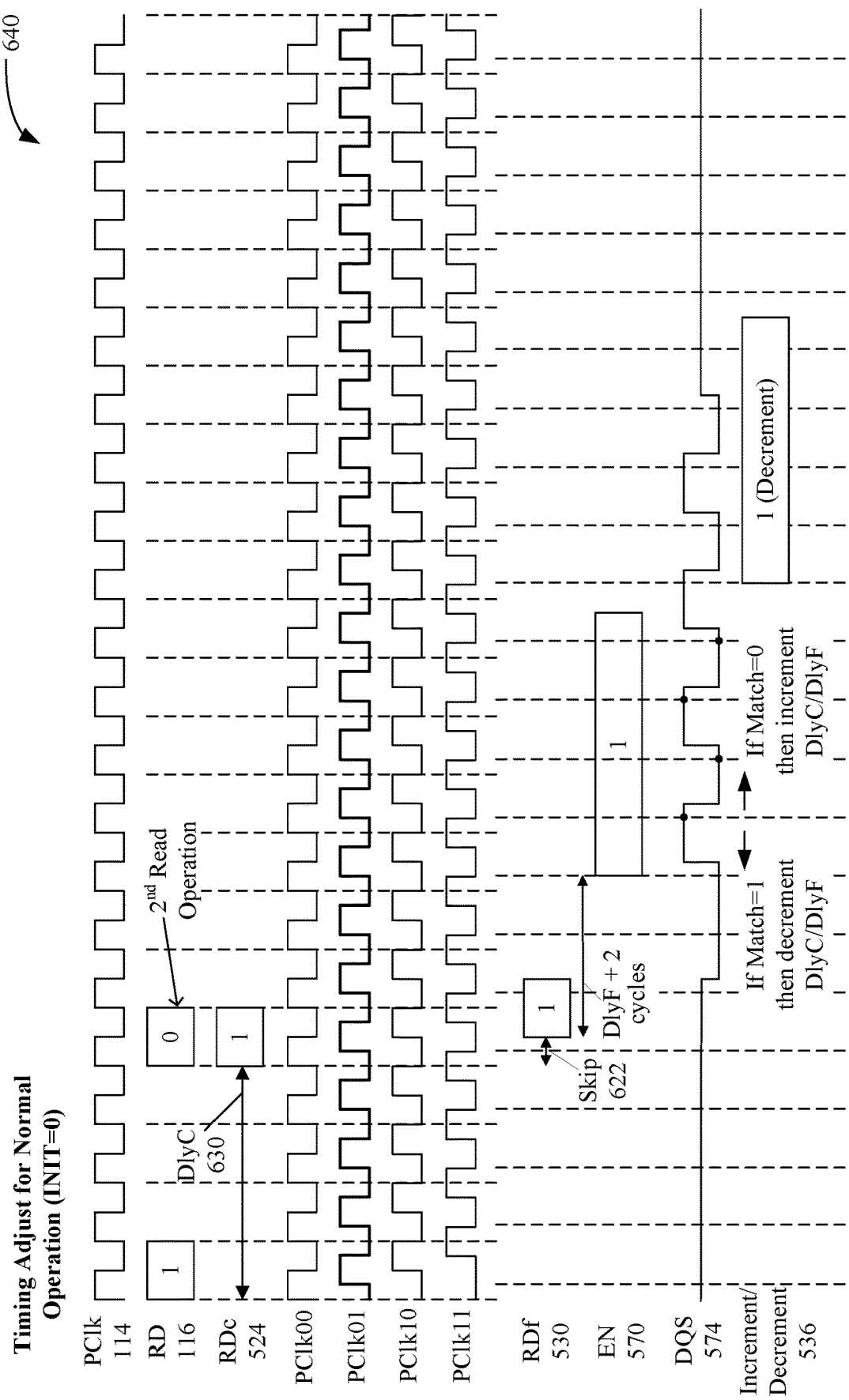
Figure 6D:
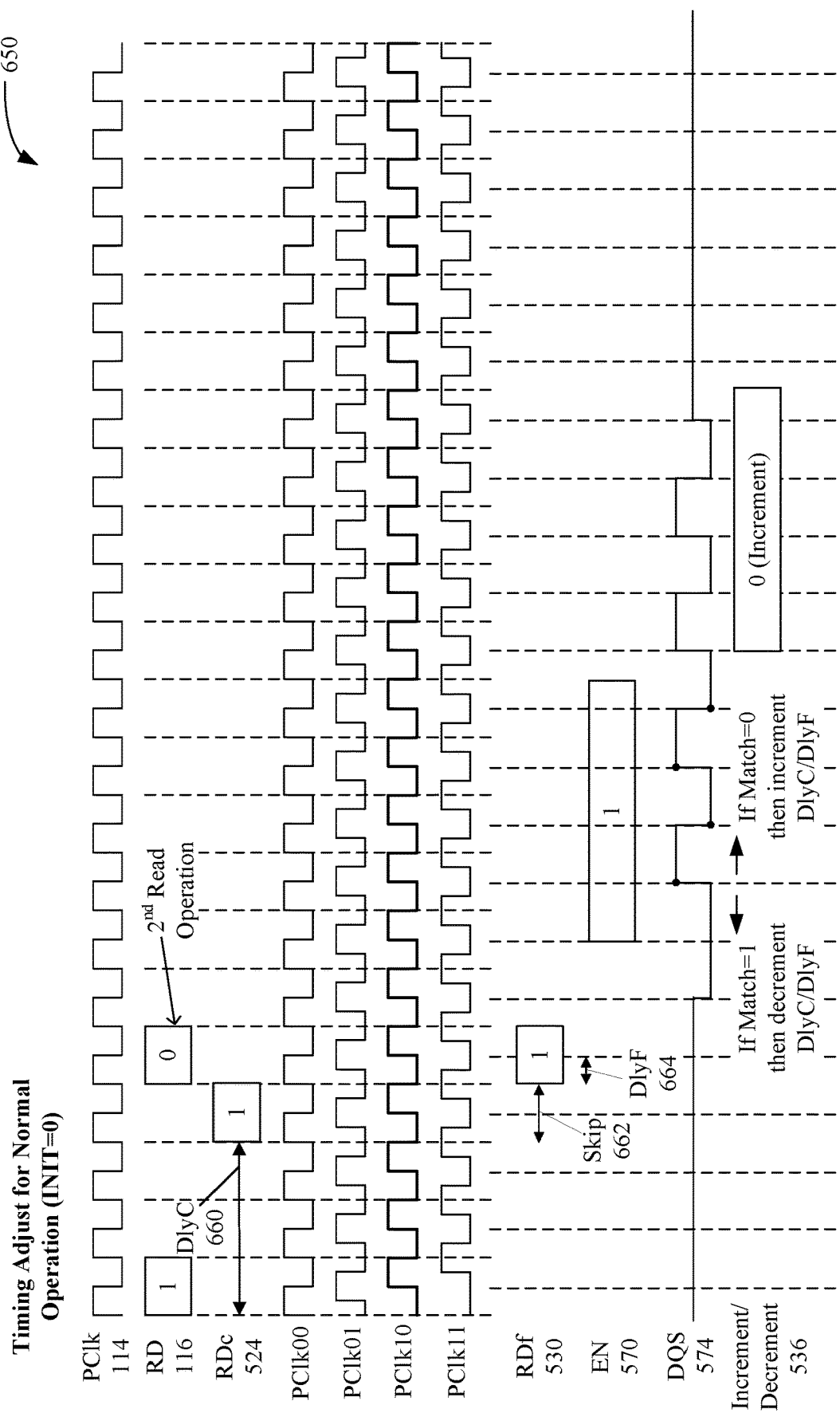
Figure 6E:
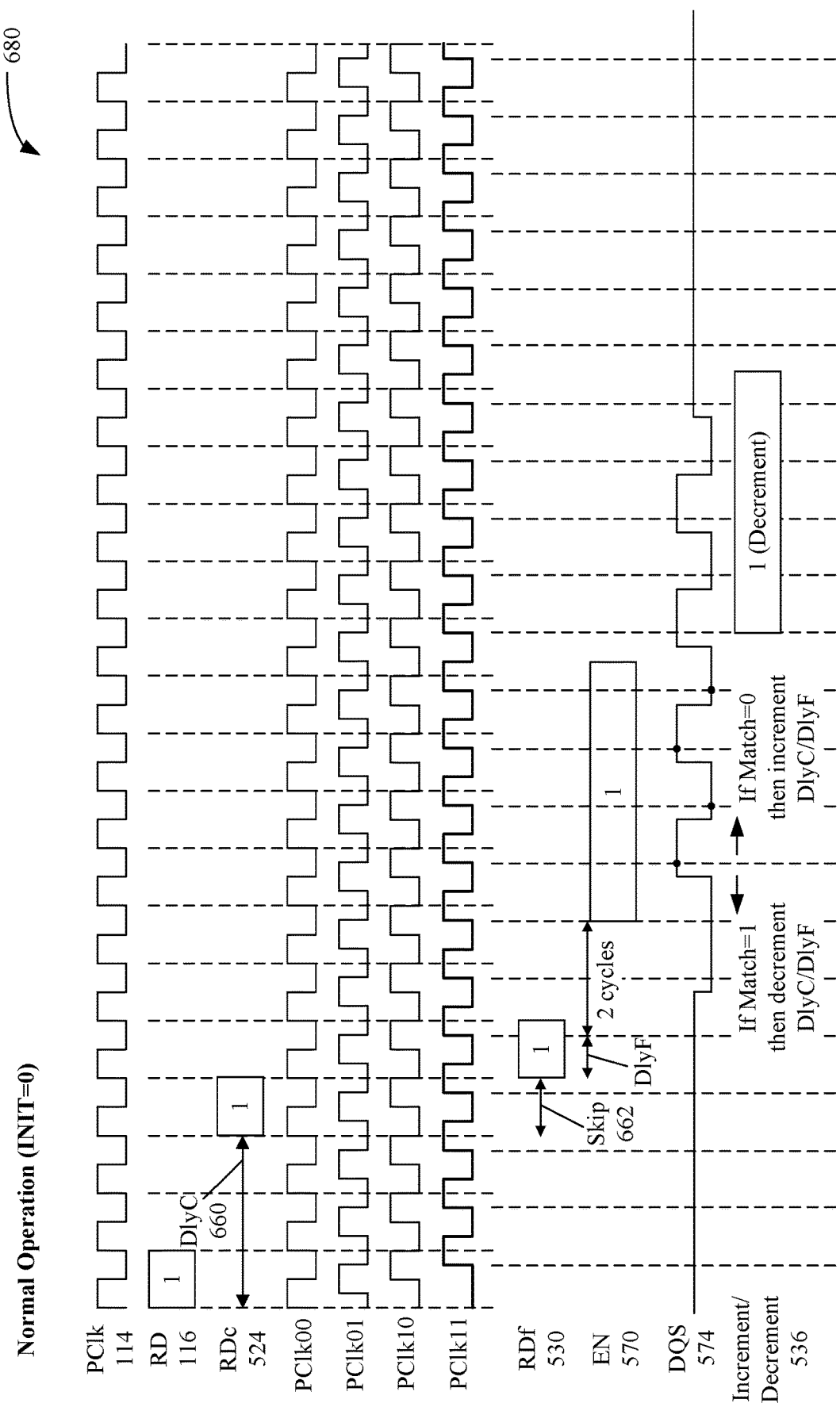

The operation of the circuits 500 (FIG. 5A) and 550 is illustrated in FIGS. 6A-6E. FIGS. 6A and 6B are timing diagrams for a first mode of operation (INIT=1), and FIGS. 6C, 6D and 6E are timing diagrams for the second mode of operation (INIT=0). Note that in FIGS. 6A-6D, two or more read burst operations have been initiated. The second read command (and any subsequent read commands) results in a normal read operation in the memory device 124 (FIG. 1A), including a data strobe and read data being returned. However, in FIGS. 6A and 6B (which correspond to the first mode of operation, with INIT=1) only the first read command initiates a high pulse or value for one clock cycle of RDc 524 and extends the window corresponding to the enable signal 570. The second read command is shown in the FIGS. 6A-6D by a RD=0 signal that occurs four clock cycles after the first read command. Because the second read command does not cause an RD=1 input to circuitry 500, the second read command does not extend the strobe enable window. The additional read commands ensure that there are valid data strobe 574 signal levels after the first read operation. The memory controller 110 (FIG. 1A), therefore, is capable of supplying and distinguishing between these two different types of read commands during the first mode of operation.

FIG. 6A is a block diagram illustrating an embodiment of a timing diagram 600. The first read command is delayed by coarse delay 610 and asserted for one clock cycle as RDc 524. The appropriate phase of the clock signals output by the offset clock generator 516 (FIG. 5A) is selected. In this case, it is PClk11. The multiplexer 528 (FIG. 5A) applies skip delay 612 in accordance with the DlyF[1] (the most significant bit of DlyF 614) to produce RDf 530. RDf 530 is then delayed in accordance with DlyF 614 by synchronizing it with PClkF in latches 560 (FIG. 5B) to produce the enable signal 570 window EN.

Six samples of the data strobe 574 are compared to an expected pattern (represented by a set of six dots synchronized to the upward transitions of the PClkF clock signal) during the enable signal 570 window EN, which is 6.5 clock cycles wide. Since the received pattern and the expected pattern do not match (Match=0), and INIT=1 (first mode of operation), increment/decrement signal 536 is set to decrement (1). In the first mode of operation (INIT=1), when Match=0 (indicating the enable window is not yet properly positioned), the increment/decrement signal 536 is set equal to decrement (1), and when Match=1 (indicating the enable window is properly positioned), the increment/decrement signal 536 is set equal to increment (0).

Eventually, the delay is reduced sufficiently that the received pattern and the expected pattern match. This is illustrated in timing diagram 620 of FIG. 6B. Coarse delay 621 is now four clock cycles, the skip delay 622 is a half clock cycle, and the fine delay 624 is 0.75 clock cycles. As a result, the beginning of the enable signal window EN is delayed by 1.25 clock cycles (0.5+0.75 clock cycles) from the beginning of the RDc signal 524. The appropriate phase of the clock signal output by the offset clock generator 516 (FIG. 5A) is PClk01 (0.25 clock cycles delayed from PClk). As shown, the six samples of the data strobe 574 match the expected pattern (Match=1), including the preamble of the data strobe 574. The circuit 550 (FIG. 5B) is, therefore, switched to the second mode of operation. In addition, increment/decrement is set to 0 (increment), causing the delay to be increased by a quarter clock cycle.

The second mode of operation (INIT=0) is illustrated by the timing diagrams 640, 650 and 680 in FIGS. 6C, 6D and 6E. Note that the enable signal 570 window EN is now 4.5 clock cycles wide and four samples are used when comparing the data strobe 574 and the expected pattern. In the second mode of operation (INIT=0), when there is a pattern match (as indicated by Match=1), increment/decrement 536 is set to decrement (1) (as shown in FIGS. 6C and 6E), and when there is no pattern match, increment/decrement 536 is set to increment (0) (as shown in FIG. 6D). This results in dithering about the desired delay target. This is illustrated in the timing diagrams 650 and 680 of FIGS. 6D and 6E. FIG. 6C represents a timing diagram 640 of an exemplary read cycle that is used for adjusting the enable window 570, in the second mode of operation, prior to reaching the dither point. In the particular, at this point of the timing adjustment process, the receiving device has incremented DlyC/DlyF once during the first read cycle of the second mode of operation, and then decremented DlyC/DlyF once at the next read cycle, thereby returning DlyC/DlyF to the same value as it had at the termination of the first mode of operation. In FIG. 6C, the coarse delay 630 is four clock cycles, skip delay 622 is a half cycle, and the fine delay 624 is 0.75 clock cycles, for a total delay of 5.25 clock cycles. Furthermore, the increment/decrement signal 536 is equal to decrement (1) because the DQS signal that falls within the enable window matches the predefined pattern (Match=1). During subsequent read cycles, DlyC/DlyF will continue to be decremented until the DQS signal that falls within the enable window no longer matches the predefined pattern (Match=0), as represented by timing diagram 680 in FIG. 6D. In FIG. 6D, coarse delay DlyC 660 is three clock cycles, skip delay 662 is a full cycle, and the fine delay DlyF 664 is 0.50 clock cycles. In FIG. 6D the delay from the read command RD to the enable signal window EN, 4.5 clock cycles, is 0.75 clock cycles less than the delay in FIG. 6C. Because Match=0, increment/decrement signal 536 changes from decrement (1) to increment (0), which means the circuit has reached the dither point. After reaching the dither point, the delay will be alternately decreased and increased, as represented by FIG. 6E, so long as the relative timing of the data strobe and the read command signal remain unchanged.

Figure 7:
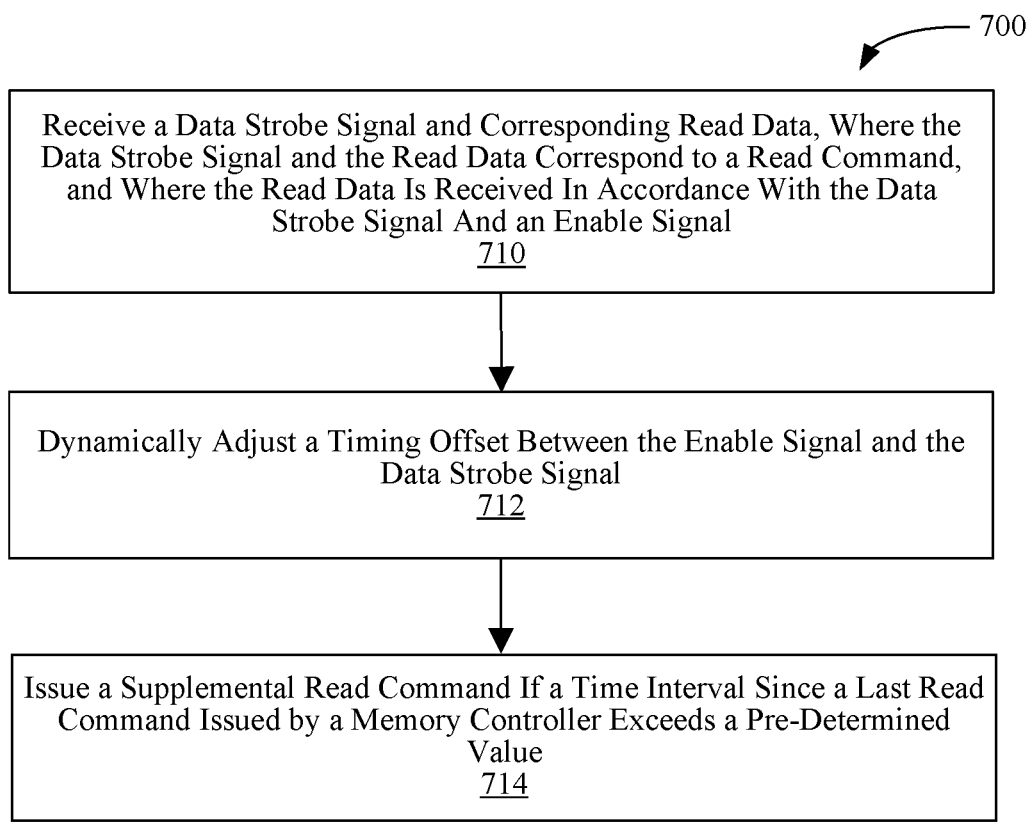
FIG. 7 is a flow diagram illustrating an embodiment of a method of timing drift cancellation.

We now discuss embodiments of processes for reducing and/or eliminating timing drift. FIG. 7 is a flow diagram illustrating an embodiment 700 of a method of timing drift cancellation. This method may be implemented using any of the circuits and systems described above, as well as other circuits or systems that utilize the techniques described herein. A data strobe signal and corresponding read data are received (710). The data strobe signal and the read data correspond to a read command, and the read data is received in accordance with the data strobe signal and an enable signal. A timing offset between the enable signal and the data strobe signal is dynamically adjusted (712). A supplemental read command is issued if a time interval since a last read command issued by a memory controller exceeds a predetermined value (714). In some embodiments, there may be fewer or additional operations, an order of the operations may be rearranged, and/or two or more operations may be combined.

Devices and circuits described herein can be implemented using computer aided design tools available in the art, and embodied by computer readable files containing software descriptions of such circuits, at behavioral, register transfer, logic component, transistor and layout geometry level descriptions stored on storage media or communicated by carrier waves. Data formats in which such descriptions can be implemented include, but are not limited to, formats supporting behavioral languages like C, formats supporting register transfer level RTL languages like Verilog and VHDL, and formats supporting geometry description languages like GDSII, GDSIII, GDSIV, CIF, MEBES and other suitable formats and languages. Data transfers of such files on machine readable media including carrier waves can be done electronically over the diverse media on the Internet or through email, for example. Physical files can be implemented on machine readable media such as 4 mm magnetic tape, 8 mm magnetic tape, 3½ inch floppy media, CDs, DVDs and so on.

Figure 8:
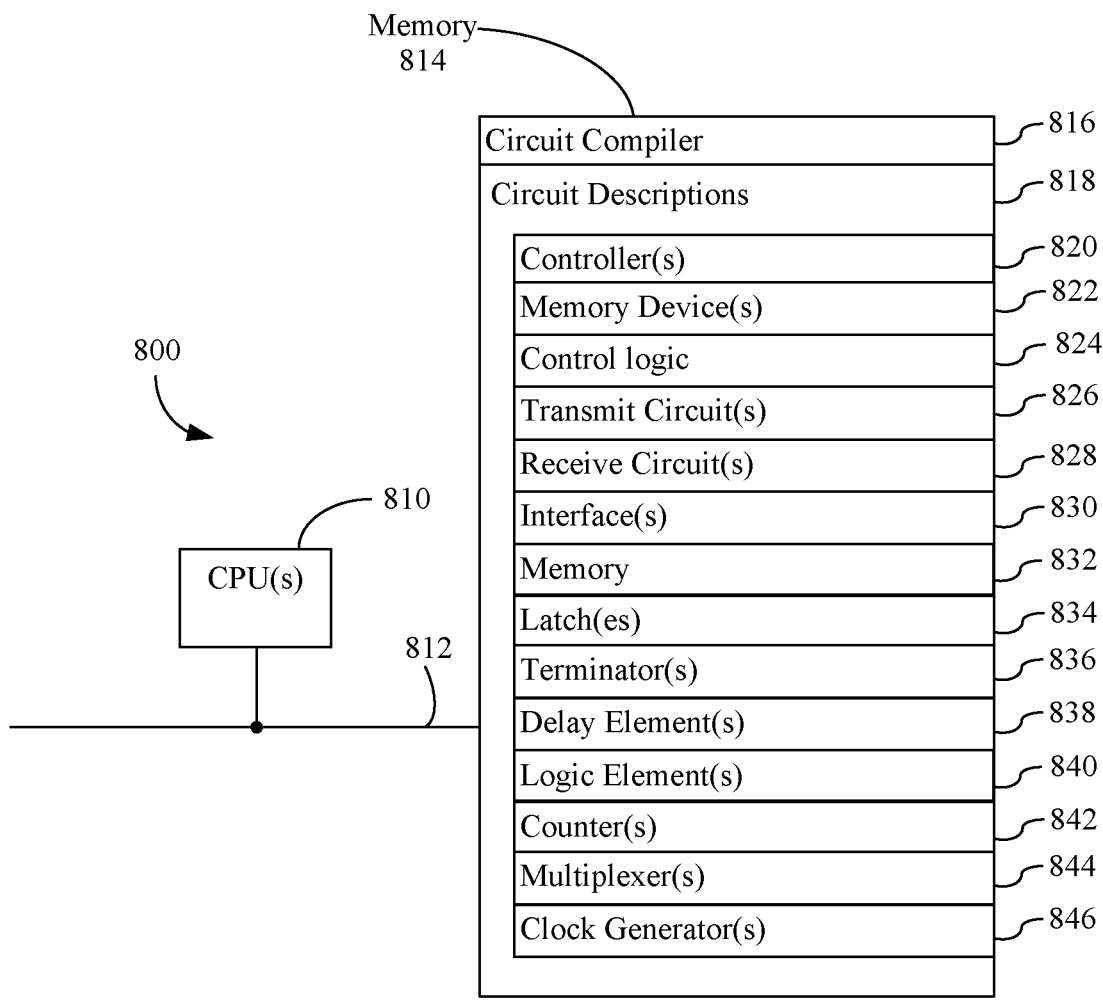
FIG. 8 is a block diagram illustrating an embodiment of a system.

FIG. 8 is a block diagram illustrating an embodiment of a system 800 for storing computer readable files containing software descriptions of one or more of the circuits described above. The system 800 may include at least one data processor or central processing unit (CPU) 810, memory 814 and one or more signal lines or communication busses 812 for coupling these components to one another. Memory 814 may include high-speed random access memory and/or non-volatile memory, such as one or more magnetic disk storage devices. Memory 814 may store a circuit compiler 816 and circuit descriptions 818. Circuit descriptions 818 may include circuit descriptions for the circuits, or a subset of the circuits discussed above with respect to FIGS. 1-6. In particular, circuit descriptions 818 may include circuit descriptions of one or more controllers 820, one or more memory devices 822, control logic 824, one or more transmit circuits 826, one or more receive circuits 828, one or more interfaces 830, memory or memory cores 832, one or more latches 834, one or more terminators 836, one or more delay elements 838, one or more logic elements 840, one or more counters 842, one or more multiplexers 844, and/or one or more clock generators 846.

The foregoing descriptions of specific embodiments of the present invention are presented for purposes of illustration and description. They are not intended to be exhaustive or to limit the invention to the precise forms disclosed. Rather, it should be appreciated that many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A memory controller, comprising:
   an interface to receive a data strobe signal and corresponding read data, wherein the data strobe signal and the read data correspond to a read command issued by the memory controller, and wherein the read data is received in accordance with the data strobe signal;
   data receive circuitry, including gate logic to gate the data strobe signal with an internally generated data strobe enable signal to generate a clean data strobe signal, and data capture logic responsive to the clean data strobe signal to capture the read data;
   burst error detection circuitry to generate a burst error signal indicating whether a count of edges of the clean data strobe signal during a memory read is equal to a predefined value; and
   data strobe adjust circuitry to adjust timing of the internally generated data strobe enable signal in accordance with a value of the burst error signal.

2. The memory controller of claim 1, wherein the data strobe adjust circuit adjusts a delay of the data strobe enable signal if a burst error is detected or a data strobe sample is determined to meet a predefined timing condition.

3. The memory controller of claim 1, wherein the burst error detection circuitry detects a burst error and asserts a corresponding output when the data strobe enable signal does not correspond to a predetermined number of rising edges of the clean data strobe signal.

4. The memory controller of claim 1, wherein the data strobe adjust circuitry is coupled to receive the burst error signal by a logic gate that logically combines the burst error signal with a data strobe timing evaluation signal, adjusts a delay value by an offset value in accordance with a logic signal output by the logic gate, and generates the internally generated data strobe enable signal in accordance with the adjusted delay value.

5. The memory controller of claim 1, including
a comparison circuit to determine a current timing offset between the data strobe signal and the internally generated data strobe enable signal; and
a circuit to dynamically determine a mode of operation of the memory controller in accordance with the determined current timing offset.

6. The memory controller of claim 5,
wherein the circuit to dynamically determine the mode of operation of the memory controller includes a lock detect circuit to detect when the current timing offset is less than a predefined threshold and to output a lock signal when the current timing offset is less than a predefined threshold.

7. The memory controller of claim 6, further comprising an on-die termination circuit for terminating the data strobe signal, wherein a predefined normal mode of operation of the on-die termination circuit for terminating the data strobe signal is enabled in response to the lock signal.

8. The memory controller of claim 7, further comprising:
a receive circuit having an input coupled to an output of the on-die termination circuit for terminating the data strobe signal and an output that outputs a first internal signal corresponding to the data strobe signal; and
wherein the gate logic includes a gate circuit having an input coupled to receive the first internal signal corresponding to the data strobe signal and an output that outputs a second internal signal corresponding to the data strobe signal, the second internal signal comprising the clean data strobe signal, wherein the gate circuit filters out spurious transitions in the first internal signal corresponding to the data strobe signal.

9. The memory controller of claim 8, further comprising circuitry that receives the second internal signal corresponding to the data strobe signal and, in response, outputs a write select signal, which directs writing of received data received by the memory controller.

10. The memory controller of claim 8, further comprising counter circuitry that counts edges in the second internal signal corresponding to the data strobe signal and outputs a write select signal, which directs writing of received data received by the memory controller.

11. The memory controller of claim 5, wherein the data strobe adjust circuit includes a timing adjustment circuit to dynamically adjust the current timing offset between the data strobe signal and the internally generated data strobe enable signal, the timing adjustment circuit configured to generate at least one early/late signal indicating whether the received data strobe signal is early or late relative to a timing window for the internally generated data strobe enable signal, and to increase or decrease the current timing offset in accordance with a current value of the early/late signal.

12. The memory controller of claim 1, further comprising a first-in first-out (FIFO) memory for storing the received read data at times indicated by the received data strobe signal and for outputting the read data stored in the FIFO memory at times indicated by an internally generated block signal.

13. A method of operating a memory controller, comprising:
receiving, at an interface of the memory controller, a data strobe signal and corresponding read data, wherein the data strobe signal and the read data correspond to a read command issued by the memory controller, and wherein the read data is received in accordance with the data strobe signal;
gating the data strobe signal with an internally generated data strobe enable signal to generate a clean data strobe signal;
acquiring the read data using the clean data strobe signal;
generating a burst error signal indicating whether a count of edges of the clean data strobe signal during a memory read is equal to a predefined value; and
adjusting timing of the internally generated data strobe enable signal in accordance with a value of the burst error signal.

14. The method of claim 13, including logically combining the burst error signal with a data strobe timing evaluation signal to produce a logic signal, adjusting a delay value by an offset value in accordance with the logic signal, and generating the internally generated data strobe enable signal in accordance with the adjusted delay value.

15. The method of claim 13, including
determining a current timing offset between the data strobe signal and the internally generated data strobe enable signal; and
dynamically determining a mode of operation of the memory controller in accordance with the determined current timing offset.

16. The method of claim 15, including detecting when the current timing offset is less than a predefined threshold, outputting a lock signal when the current timing offset is less than a predefined threshold, and in response to the lock signal being output, enabling termination of the data strobe signal with an on-die termination circuit.

17. The method of claim 16, further comprising:
using the on-die termination circuit, receiving the data strobe signal and outputting a first internal signal corresponding to the received data strobe signal; and
filtering the first internal signal corresponding to the data strobe signal to produce a second internal signal corresponding to the data strobe signal, the second internal signal comprising the clean data strobe signal, wherein the filtering filters out spurious transitions in the first internal signal corresponding to the data strobe signal.

18. The method of claim 17, further comprising: generating a write select signal in response to the second internal signal corresponding to the data strobe signal, the write select signal directing writing of received data received by the memory controller.

19. The method of claim 17, further comprising: counting edges in the second internal signal corresponding to the data strobe signal and outputting a write select signal, which directs writing of received data received by the memory controller.

20. A memory controller, comprising:
an interface to receive a data strobe signal and corresponding read data, wherein the data strobe signal and the read data correspond to a read command issued by the memory controller, and wherein the read data is received in accordance with the data strobe signal;
means for gating the data strobe signal with an internally generated data strobe enable signal to generate a clean data strobe signal;

means responsive to the clean data strobe signal to capture the read data;
burst error detection means for generating a burst error signal indicating whether a count of edges of the clean data strobe signal during a memory read is equal to a predefined value; and
strobe adjust means for adjust timing of the internally generated data strobe enable signal in accordance with a value of the burst error signal.

* * * * *